(12) United States Patent
Jang et al.

(10) Patent No.: US 6,326,226 B1
(45) Date of Patent: Dec. 4, 2001

(54) METHOD OF CRYSTALLIZING AN AMORPHOUS FILM

(75) Inventors: Jin Jang, Seoul; Soo-Young Yoon, Daejeon; Jae-Young Oh, Jeju-do, all of (KR)

(73) Assignee: LG. Philips LCD Co., Ltd., Seoul (KR)

( * ) Notice: Subject to any disclaimer, the term of this patent is extended or adjusted under 35 U.S.C. 154(b) by 0 days.

(21) Appl. No.: 09/115,498

(22) Filed: Jul. 14, 1998

(30) Foreign Application Priority Data

| Jul. 15, 1997 | (KR) | 97-32848 |
| Aug. 14, 1997 | (KR) | 97-38965 |
| Jan. 21, 1998 | (KR) | 98-1653 |
| Jan. 21, 1998 | (KR) | 98-1654 |

(51) Int. Cl.[7] ............ H01L 21/20; H01L 21/36
(52) U.S. Cl. ........................................ 438/48 C
(58) Field of Search .......... 257/66, 55; 438/149, 438/151, 486

(56) References Cited

U.S. PATENT DOCUMENTS

| 4,309,225 | 1/1982 | Fan et al. ............ 148/1.5 |
| 4,477,308 | * 10/1984 | Gibson et al. ............ 117/8 |
| 4,626,448 | 12/1986 | Hays ...................... 427/39 |
| 5,147,826 | 9/1992 | Liu et al. .............. 437/233 |
| 5,275,851 | 1/1994 | Fonash et al. ......... 427/578 |
| 5,364,664 | 11/1994 | Tsubouchi et al. ..... 427/535 |
| 5,403,763 | 4/1995 | Yamazaki ............. 437/44 |
| 5,403,772 | 4/1995 | Zhang et al. .......... 437/101 |
| 5,426,064 | 6/1995 | Zhang et al. .......... 437/40 |
| 5,481,121 | 1/1996 | Zhang et al. .......... 257/64 |
| 5,488,000 | 1/1996 | Zhang et al. .......... 437/21 |
| 5,492,843 | 2/1996 | Adachi et al. ......... 437/21 |
| 5,501,989 | 3/1996 | Takayama et al. ..... 437/21 |
| 5,508,533 | 4/1996 | Takemura .............. 257/64 |
| 5,529,937 | 6/1996 | Zhang et al. .......... 437/10 |
| 5,534,716 | 7/1996 | Takemura .............. 257/72 |

(List continued on next page.)

FOREIGN PATENT DOCUMENTS

| 2-140915 | 5/1990 | (JP) . |
| 8-006053 | 1/1996 | (JP) . |

OTHER PUBLICATIONS

Seok–Woon Lee et al., Low Temperature Poly–Si Thin Film Transistor Fabrication by Metal–Induced Lateral Crystallization, IEEE Electron Device Letters, vol. 17, No. 4, Apr. 1995 pp 160–162.*

Jin Jang et al., "Electric–field–enhance crystalliziation of amorphous silicon", Oct. 1998, Nature Magazine, vol., 395 pp. 481–483.*

K. S. Song, S. H. Park, S. I. Jun & D. K. Choi, "*Crystallization of the Amorphous Silicon Using Field Aided Lateral Crystallization*", Feb. 1997; pp. 144–150.

K. S. Song, S. H. Park, S. I. Jun & D. K. Choi, "*Effect of Ni and Al on the Low Temperature Field Aided Lateral Crystallization (FALC)*", Materials Research Society, Apr. 1998; p. 55.

(List continued on next page.)

*Primary Examiner*—Long Pham
*Assistant Examiner*—William David Coleman
(74) *Attorney, Agent, or Firm*—Long Aldridge & Norman LLP

(57) ABSTRACT

A method of crystallizing an amorphous film includes the steps of forming an amorphous film capable of being crystallized on a substrate, the amorphous film being in contact with a metal layer; and crystallizing the amorphous film by forming an electric field in the amorphous film and the metal layer, while simultaneously subjecting the amorphous film and the metal layer to a thermal treatment, thereby crystallizing the amorphous film.

56 Claims, 20 Drawing Sheets

U.S. PATENT DOCUMENTS

| | | | |
|---|---|---|---|
| 5,543,352 | | 8/1996 | Ohtani et al. ......................... 437/101 |
| 5,550,070 | | 8/1996 | Funai et al. ............................. 437/41 |
| 5,569,610 | | 10/1996 | Zhang et al. ............................ 437/21 |
| 5,576,222 | | 11/1996 | Arai et al. ................................. 437/4 |
| 5,606,179 | * | 2/1997 | Yamazaki et al. ...................... 257/59 |
| 5,610,737 | * | 3/1997 | Akiyama et al. ....................... 349/47 |
| 5,619,044 | | 4/1997 | Makita et al. ........................... 257/64 |
| 5,639,698 | | 6/1997 | Yamazaki et al. ................... 437/228 |
| 5,663,077 | | 9/1997 | Adachi et al. ........................ 438/151 |
| 5,677,240 | * | 10/1997 | Murakami et al. .................. 438/151 |
| 5,985,741 | * | 11/1999 | Yamazaki et al. ................... 438/436 |
| 6,066,547 | | 5/2000 | Maekawa ............................. 438/486 |
| 6,097,037 | * | 8/2000 | Joo et al. ................................ 257/55 |

OTHER PUBLICATIONS

K. S. Song & D. K. Choi, "*Electric Field Effect on the Metal Induced Crystallization of Amorphous Silicon*", The Electrochemical Society, Inc., Proceedings of the 8$^{th}$ International Symposium, Proceedings vol. 97–23, pp. 75–80.

K.S. Song, S. H. Park, S. I. Jun. & D. K. Choi, "*I–V Characteristics of Poly–Silicon Thin Film Transistors By Field Aided Lateral Crystallization (FALC)*",. 5$^{th}$ International Conference on VSLI and CAD, Oct., 1997; pp. 187–189.

K. S. Song, S. H. Park, S. I. Jun & D. K. Choi, "*Fabrication of Low Temperature Poly–Silicon Thin Film Transistor Using Field Aided Lateral Crystallization (FALC)*", The 1$^{st}$ Asian–European International Conference on Plasma Surface Engineering, Oct. 5–9, 1997.

K. S. Song, S. H. Park, S. I. Jun & D. K. Choi, "*Enhanced Crystallization of Amorphous Silicon Using Electric Field*", Proceedings of the 12$^{th}$ KACG Technical Meeting; p. 243.

Y. Masaki, P. G. LeComber & A. G. Fitzgerald, "*Solid Phase Crystallization of Thin Films of Si Prepared by Plasma–Enhanced Chemical Vapor Deposition*", J. App. Physics. 74 (1), Jul., 1993; pp. 129–134.

D. K. Sohn, J. N. Lee, S. W. Kang & B. T Ahn, "*Low Temperature Crystallization of Amorphous Si Films by Metal Adsorption and Diffusion*", Jpn. J. Appl. Phys. vol. 34 (1996); pp. 1005–1009.

J. I. Ryu, H. C. Kim, S. K. Kim & J. Jang, "*A Novel Self–Aligned Polycrystalline Silicon Thin–Film Transistor Using Silicide Layers*", IEEE Electron Device Letters, vol. 18, No. 6, Jun., 1997, pp. 123–125.

Y. Kawazu, H. Kudo, S. Onari & T. Arai, "*Low Temperature Crystallization of Hydrogenated Amorphous Silicon Induced by Nickel Silicide Formation*", Jpn. J. Appl. Phys. vol. 29, No. 12, Dec., 1990; pp. 2698–2704.

Song, K.S., S.H. Park, S.I. Jun and D.K. Choi, "Crustallization of the Amorphous Silicon Using Field Aided Lateral Crystallization," Department of Inorganic Materials Engineering, Hanyang University, pp. 144–150.

Song, Kyung–Sub, and Duck–Kyun Choi, "Electric Field Effect on the Metal Induced Crystallization of Amorphous Silicon," *Silicon–on Insulator Technology and Devices*. The Electrochemical Society, Inc. Proceedings vol. 97–23, pp. 75–80.

Song, Kyung–Sub, Seung–Ik Jun, Sang–Hyun Park and Duck–Kyun Choi, "I–V Characteristics of Poly–Silicon Thin Film Transistors By Field Aided Lateral Crystallization (FALC),"*5th International Conference on VLSI and CAD*. Oct. 13–15, 1997, pp. 187–189.

Jun, Seung–Ik, Kyung–Sub Song, Sang–Hyun Park and Duck–Kyun Choi, "Fabrication of Low Temperature Poly––Silicon Thin Film Transistor Using Field Aided Lateral Crystallization (FALC)," Department of Inorganic Materials Engineering, Hanyang University, Oct. 5–9, 1997.

Song, Kyung–Sub, Seung–Ik Jun, Sang–Hyun Park and Duck–Kyun Choi, "Enhanced Crystallization of Amorphous Silicon Using Electric Field," Department of Inorganic Materials Engineering, Hanyang University.

Masaki, Y., P. G. LeComber, and A. G. Fitzgerald, "Solid Phase Crystallization of Thin Films of Si Prepared by Plasma–Enhanced Chemical Vapor Deposition," 1993 American Institute on Physics. pp. 129–134.

Sohn, Dong Kyun, Jeong No Lee, Sang Won Kang and Byung Tae Ahn, "Low–Temperature Crystallization of Amorphous Si Films By Metal Adsorption and Diffusion," Department of Materials Science and Engineering, Korea Advance Institute of Science and Technology, pp. 1005–1009.

Jai II Ryu, Hyun Churl Kim, Sung Ki Kim and Jin Jang, "A Novel Self–Aligned Polycrystalline Silicon Thin–Film Transistor Using Silicide Layers," IEEE Electron Device Letters, vol. 11, No 6, Jun. 1997, pp. 123–125.

* cited by examiner

METHOD OF CRYSTALLIZING AN AMORPHOUS FILM

This application claims the benefit of Korean Patent Application No. 1997-32848, filed Jul. 15, 1997, Korean Application No. 1997-38965, filed on Aug. 14, 1997, Korean Patent Application No. 1998-1653, filed Jan. 21, 1998, and Korean Application No. 1998-1654, filed on Jan. 21, 1998, which are hereby incorporated by reference.

BACKGROUND OF THE INVENTION

1. Field of the Invention

The present invention relates to a method for crystallizing an amorphous film. More particularly, the present invention relates to a method for crystallizing an amorphous film by forming electrodes on the amorphous film, providing a very thin metal layer connected to the electrodes, and applying an electrical field across the amorphous film while heating the amorphous film.

2. Discussion of the Related Art

Polycrystalline silicon films have come into widespread use as active regions of thin film transistors in semiconductor devices, especially for liquid crystal displays. The use of polycrystalline silicon in thin film transistors has increased because polycrystalline silicon has lower defect density and higher field effect mobility than amorphous silicon. While polycrystalline silicon is usually formed under high temperature conditions, methods of fabricating polycrystalline silicon thin film transistors (polysilicon TFT) under low temperatures have recently been introduced.

Low temperature polycrystalline silicon (polysilicon) can be manufactured on a relatively large scale using a low processing temperature and can be manufactured to have performance characteristics similar to high temperature polysilicon. Various methods are known for forming low temperature polysilicon such as Solid Phase Crystallization, Laser Crystallization and the like.

Laser Crystallization is a method of crystallizing an amorphous film by thermal treatment applied to the amorphous film using a laser. For example, low temperature crystallization as described by Hiroyaki Kuriyama et al., Jpn. J. Phys. 31, 4550 (1992), is performed at 400° C. and provides a crystallized product having excellent performance characteristics. Unfortunately, this method is unsuitable for uniform crystallization and fabrication of polysilicon on large substrates because of its low efficiency and the need to employ expensive equipment.

Solid Phase Crystallization requires thermal treatment of amorphous silicon at 550 to 700° C. for 1 to 24 hours, uses inexpensive equipment, and produces crystals of uniform size. However, the method cannot be applied to amorphous silicon formed over glass substrates, due to the method's relatively high temperature and long processing time. This method also has poor yields.

A recently introduced method for crystallizing amorphous silicon at low temperatures is Metal Induced Crystallization (MIC), discussed in M. S. Haque et al., Appl. Phys. 79, 7529 (1996). MIC is an excellent method for reducing the temperature of crystallizing amorphous silicon and involves providing a specific kind of metal in contact with amorphous silicon. The metal may be provided as a thin film on the amorphous silicon so that the metal provides nucleation sites over the amorphous film. In MIC using Ni as the nucleation metal, described in C. Hayzelden et al., J. Appl. Phys. 73, 8279 (1993), $NiSi_2$, which is the lowest formation energy phase of nickel silicide, forms and acts as a nucleus to accelerate the crystallization of the amorphous silicon. Actually, $NiSi_2$ has the same lattice structure as silicon and the lattice constant of $NiSI_2$ is 5.405 Å, which is close to the 5.340 Å of silicon. Thus, $NiSi_2$ nucleates and accelerates crystallization in the <111> direction, as shown in C. Hayzelden et al., Appl. Phys. Lett. 60, 225 (1992). Such a method of MIC is affected by the time and temperature of thermal treatment and the quantity of metal. As the quantity of metal increases, the temperature necessary for the thermal treatment, in general, is reduced.

MIC has the advantages of increasing the effect of metal induced crystallization proportional to the quantity of metal and decreasing the temperature for low temperature crystallization. On the other hand, MIC has the disadvantage of changing the intrinsic characteristics of the resulting silicon film due to contamination inside the crystallized silicon film. Moreover, such a method requires a long thermal treatment of for 10 hours or more and, relatively, the temperature of crystallization is not as low as is desirable.

A crystallization method using a metal solution to decrease metal contamination caused by MIC has been proposed. According to this method, the surface of an amorphous silicon film is coated with a metal solution and then the amorphous silicon film is crystallized by metal induced crystallization. This method has the disadvantage of low crystallization rates but does produce reduced levels of metal contamination.

SUMMARY OF THE INVENTION

Accordingly, the present invention is directed to a method for crystallizing an amorphous film that substantially obviates one or more of the problems due to limitations and disadvantages of the related art.

An object of the present invention is to provide a method of crystallizing an amorphous film at a high speed.

Another object of the present invention is to provide a method of crystallizing an amorphous film by forming electrodes that can be used to apply a voltage across the amorphous film, and conducting a thermal treatment while simultaneously applying an electric field to the amorphous film.

A further object of the present invention is to provide a method of crystallizing an amorphous film by forming electrodes that can be used to apply a voltage across the amorphous film, forming a very thin metal layer connected to the electrodes, and conducting a thermal treatment while simultaneously applying an electric field to the amorphous film.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the invention, as embodied and broadly described, the present invention of a method of crystallizing an amorphous film includes the steps of forming an amorphous film on a substrate, wherein the amorphous film is capable of being crystallized and is contacted with a metal layer, and crystallizing the amorphous film, wherein the step of crystallizing comprises the steps of forming an electric field in the amorphous film and the thin metal layer and simultaneously performing thermal treatment on the amorphous film and the metal.

In another aspect of the present invention, a method of crystallizing an amorphous film comprises the steps of forming an amorphous film over a substrate; and crystallizing the amorphous film by forming an electric field across the amorphous film while subjecting the amorphous film to a thermal treatment.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of the specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

The following embodiments illustrate crystallizing amorphous films by applying voltage to nickel electrodes. These embodiments demonstrate methods of crystallizing amorphous films according to the present invention. Three embodiments are described, with the nickel electrodes and nickel layer positioned differently with respect to layers of amorphous silicon.

Figure 1:
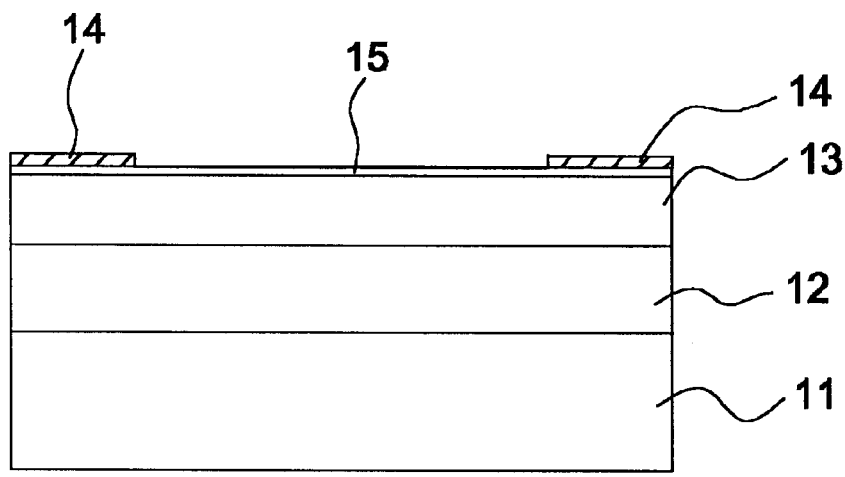
FIG. 1 shows a first embodiment of crystallizing an amorphous film according to the present invention, prior to crystallization.
Figure 2:
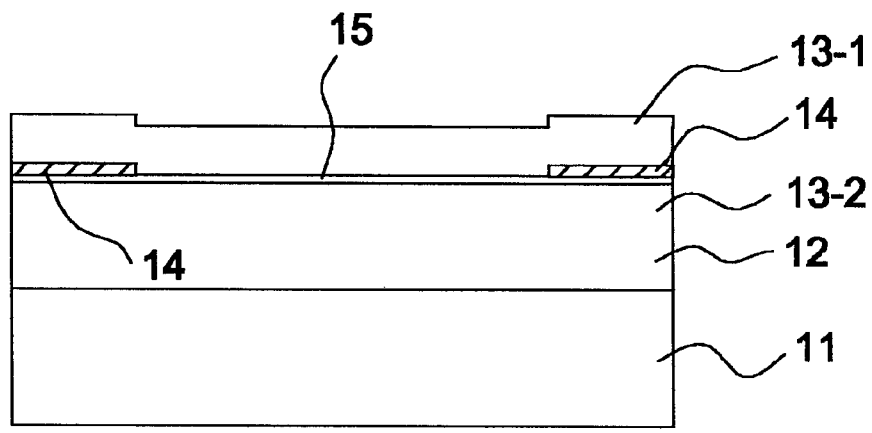
FIG. 2 shows a second embodiment of crystallizing an amorphous film according to the present invention, prior to crystallization.
Figure 3:
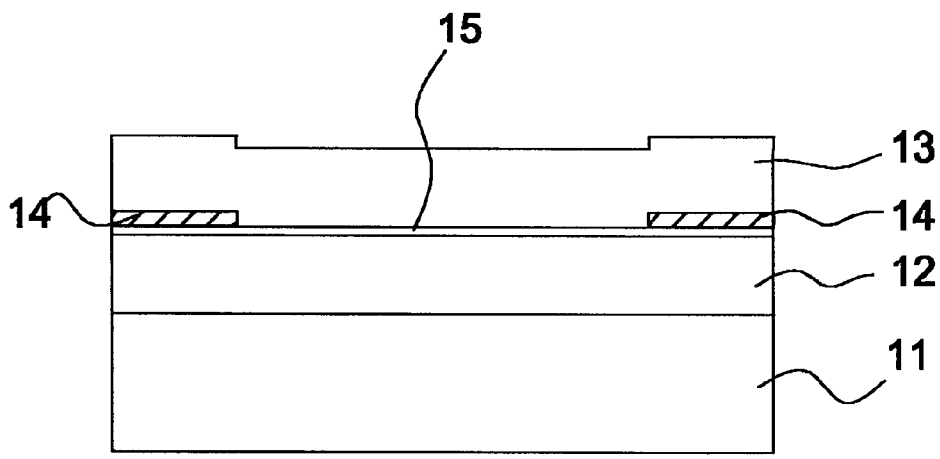
FIG. 3 shows a third embodiment of crystallizing an amorphous film according to the present invention, prior to crystallization.
Figure 4:
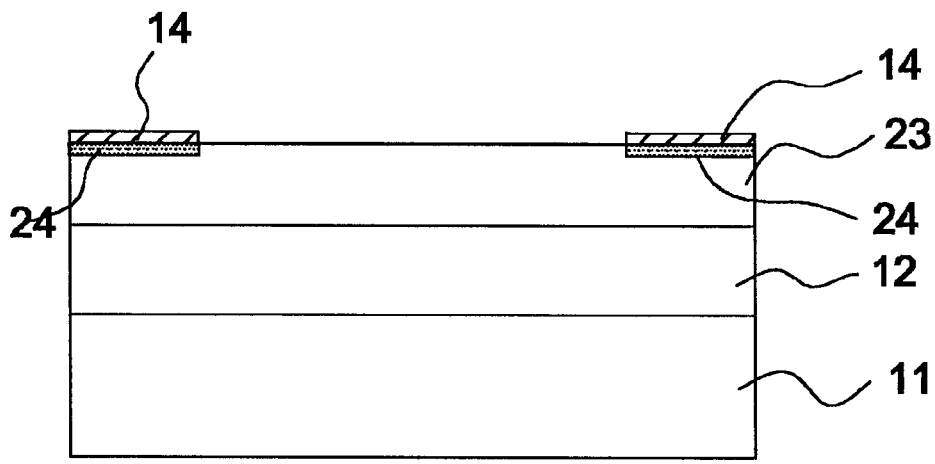
FIG. 4 is a cross-sectional view of the result of the FIG. 1 preferred embodiment of crystallizing an amorphous film according to the present invention.
Figure 5:
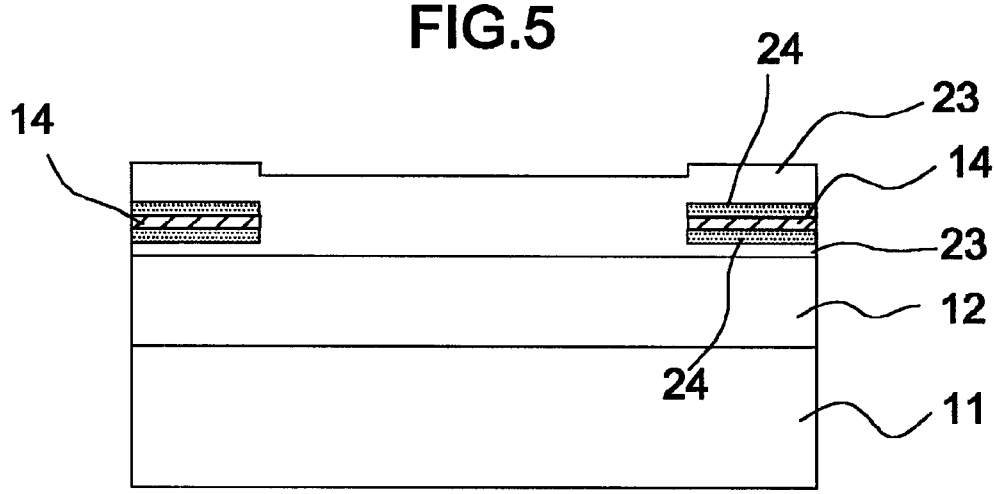
FIG. 5 is a cross-sectional view of the result of the FIG. 2 preferred embodiment of crystallizing an amorphous film according to the present invention.
Figure 6:
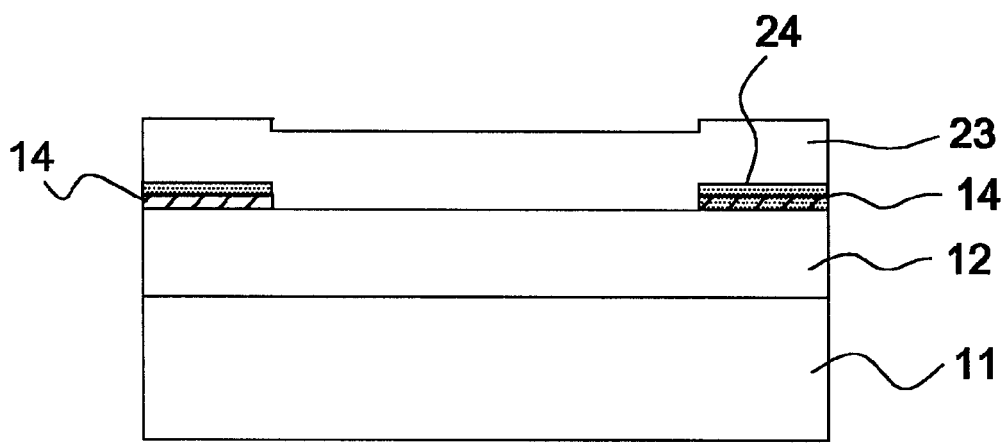
FIG. 6 is a cross-sectional view of the result of the FIG. 3 preferred embodiment of crystallizing an amorphous film according to the present invention.

FIG. 1 to FIG. 3 are cross-sectional views of the first to the third embodiments before applying an electric field to the nickel electrodes. FIG. 4 to FIG. 6 show the results, respectively, of crystallization of the amorphous films of FIG. 1 to FIG. 3 by thermal treatment while applying an electric field to the nickel electrodes.

FIG. 1 is a cross-sectional view of an amorphous silicon film which is made by forming a nickel layer 15 on an amorphous silicon film 13 after the amorphous silicon film 13 has been formed on an insulating substrate 11, and then forming nickel electrodes 14 on each end of a top surface of the nickel layer 15. Quartz, glass, or oxide is used as the insulating substrate 11. As shown in FIG. 1, a buffer layer 12 may be inserted between the insulating substrate 11 and the amorphous silicon film 13 to prevent impurities of the insulating substrate 11 from penetrating into the amorphous silicon film 13 during the process of crystallizing the amorphous silicon. Generally, an oxide layer is used as buffer layer 12.

FIG. 2 is a cross-sections view of an amorphous silicon film 13 which is made by forming a buffer layer 12 on an insulating substrate 11, depositing a first amorphous silicon layer 13-1 on the buffer layer 12, forming a nickel layer 15 on the first amorphous silicon layer 13-1, forming nickel electrodes 14 on each end of a top surface of the nickel layer 15 and depositing a second amorphous silicon layer 13-2 on the first amorphous silicon layer 13-1, including surfaces of the nickel electrodes 14. Accordingly, the first and second amorphous silicon layers together constitute an amorphous film 13. Namely, the nickel layer 15 and the nickel electrodes 14 are arranged within the amorphous silicon film 13.

FIG. 3 is a cross-sectional view of an amorphous film 13 made by forming a buffer layer 12 on an insulating substrate 11, forming a nickel layer 15 on the buffer layer 12, forming nickel electrodes 14 on each end of a top surface of the nickel layer 15 and forming an amorphous silicon film 13 over the electrodes 14 and film 15.

In the above methods, the amorphous films may be formed by any one of PECVD (Plasma Enhanced Chemical Vapor Deposition), CVD (Chemical Vapor Deposition), sputtering, or the like, wherein the amorphous silicon film is deposited to a thickness of 100 to 100,000 Å. More particularly, 100 to 100,000 Å is desirable for the thickness of deposition.

The nickel layer is formed by any one of the known methods of coating with nickel, conventional sputtering, or plasma deposition, to a thickness of 1 to 100 Å. The nickel layer is etched by photolithography to form the nickel electrodes, wherein the interval between the electrodes is 0.0001 to 500 cm, preferably 0.01 to 100 cm, and more preferably 1 to 50 cm.

The nickel layer is formed to a thickness of 0.001 to 2 Å by sputtering, which is a conventional method of depositing metal, by applying a nickel solution including nickel, or by plasma deposition. Moreover, the nickel layer is not necessarily formed by an extra step but can be formed during the step of forming the nickel electrodes. Namely, a nickel layer connected to the nickel electrodes can be attained by forming a nickel layer for the electrodes and by leaving a portion of the nickel layer.

Thermal treatment is applied to the above-described substrate for 1 to 20 minutes, at a temperature between 300 to 800° C. and in an atmosphere of nitrogen gas or a vacuum, and with a voltage between the nickel electrodes between 1 to 1,000,000 V, more desirably 10 to 10,000 V, to form a crystallized silicon film. In this case, the voltage applied between the two nickel electrodes may be arranged to vary within the above range over time. When an electric field is formed in the amorphous film, plasma may exist in the chamber where the amorphous film lies.

FIG. 4 to FIG. 6 show the results of crystallizing the amorphous films shown in FIG. 1 to FIG. 3, respectively, using thermal treatment while applying an electric field to the nickel electrodes. FIG. 4 is the result of crystallizing the amorphous silicon of the first preferred embodiment shown in FIG. 1. FIG. 5 is the result of crystallizing the amorphous silicon of the second preferred embodiment shown in FIG. 2. FIG. 6 is the result of crystallizing the amorphous silicon of the third preferred embodiment shown in FIG. 3.

Referring to FIG. 4, a cross-sectional view of the result of the first preferred embodiment, a crystallized silicon film 23 lies on the buffer layer 12 on the insulating substrate 11. A nickel-silicide layer 24 is formed on the portion of the silicon with which the nickel electrodes were in contact.

In this first preferred embodiment of the present invention, a nickel-silicide layer 24 is formed between the nickel electrodes 14 and the portion of the amorphous silicon which contacted the electrodes 14, but the nickel layer is completely consumed. Amorphous silicon and nickel metal 14 in contact with the amorphous silicon (or the nickel layer 15 shown in FIG. 1) form nickel-silicide, after which amorphous silicon is crystallized by $NiSi_2$, which is the lowest energy phase of nickel-silicide and works as a nucleus for crystallization. The speed of crystallization of the amorphous silicon film increases and the temperature of crystallization of the amorphous silicon film is reduced by applying an electric field across the amorphous silicon film and proceeding with thermal treatment. In this case, the nickel layer 15, which is extremely thin, disappears by forming nickel-silicide during the thermal treatment for the crystallization of the amorphous silicon and acting as a nucleus for the crystallization.

Referring to FIG. 5, a cross-sectional view of the result of the second preferred embodiment, a crystallized silicon film 23 lies on the buffer layer 12 on the insulating substrate 11. Nickel-silicide 24 is formed on the portion of silicon which contacted nickel electrodes 14. In this preferred embodiment of the invention, nickel-silicide is formed at the interfaces between the nickel electrodes 14 and amorphous silicon, while the nickel layer 15 has been completely depleted.

Namely, in this second embodiment of the present invention, nickel-silicide is made from amorphous silicon and nickel metal 14 (or the nickel layer 15 shown in FIG. 2). The nickel-silicide acts as an inducing material for crystallizing amorphous silicon. The speed of crystallization of the amorphous silicon film increases and the temperature of crystallization of the amorphous silicon film lowers, by forming an electric field in the amorphous silicon film and proceeding with thermal treatment. In this case, the nickel layer 15, which is extremely thin, disappears by forming nickel-silicide during thermal treatment for the crystallization of amorphous silicon and working as a nucleus for the crystallization.

Referring to FIG. 6, a cross-sectional view of the result of the third preferred embodiment, a crystallized silicon film 23 lies on the buffer layer 12 on the insulating substrate 11. Nickel-silicide 24 is formed on the portion of amorphous silicon which contacted the nickel electrodes 14.

In this preferred embodiment of the invention, nickel-silicide is formed at the interfaces between the nickel electrodes 14 and amorphous silicon, which the nickel layer 15 has been used up. In this third embodiment of the present invention, nickel-silicide results from the reaction of the amorphous silicon and nickel metal 14 (or the nickel layer 15 shown in FIG. 3). The nickel-silicide acts as an inducing material for crystallizing amorphous silicon. The speed of crystallization of the amorphous silicon film increases and the temperature of crystallization of the amorphous silicon film is reduced by applying an electric field in the amorphous silicon film and then conducting thermal treatment. In this case, the nickel layer 15, which is extremely think disappears after forming nickel-silicide during thermal treatment for the crystallization of amorphous silicon and working as a nucleus for the crystallization.

In this case, the amorphous silicon film is crystallized in an even shorter time and at an even lower temperature than in conventional methods by forming an electric field on the amorphous silicon film by applying voltage to the nickel electrodes. Since the nickel in the nickel layer works as an inducing material, the speed of crystallization of the amorphous silicon film increases and the temperature of crystallization of the amorphous silicon film lowers. In accordance with the present invention, the amorphous silicon film may be crystallized by thermal treatment at low temperatures between 300 and 800° C. and in only 1 to 20 minutes.

The present invention may be applied to the crystallization of amorphous silicon including impurities such as oxygen, nitrogen, carbon and the like, which have concentrations under $10^{22}/cm^3$.

Although nickel electrodes are used in the preferred embodiments of the invention, another metal such as a transition metal or an alloy of a transition metal may be used as the electrodes. Moreover, each of the electrodes 14 on the silicon layer may be formed from different metals. Additionally, the electrodes may comprise more than one layer.

Although a metal layer of nickel is used in the preferred embodiments, another film of a transition metal, or an alloy of transition metals, may be used for the same result. The metal layer may also be formed to have multi-layers. Even though each electrode is connected to each end of the metal layer of the preferred embodiments of the invention, the same result may be achieved by connecting one electrode to one metal layer and by connecting the other electrode to the other metal layer of a multi-layer metal layer.

Cross-sectional views of the nickel electrodes in contact with the amorphous silicon film are shown in the above preferred embodiments of the invention. However, the present invention may be applied to any electrode structure forming an electric field on the amorphous silicon film. Thus, the cross-sectional shape of the electrodes may be any goemetric shape, such as rectangular and the like. The shape of the electrode is not critical, as long as the shape of the electrode permits applying an electric field to the amorphous silicon film. Moreover, for the same reason, the location or size of the electrodes is not critical and may vary widely. In this regard, the electrodes may be formed to apply an electric field to the amorphous film either vertically or horizontally.

Figure 7:
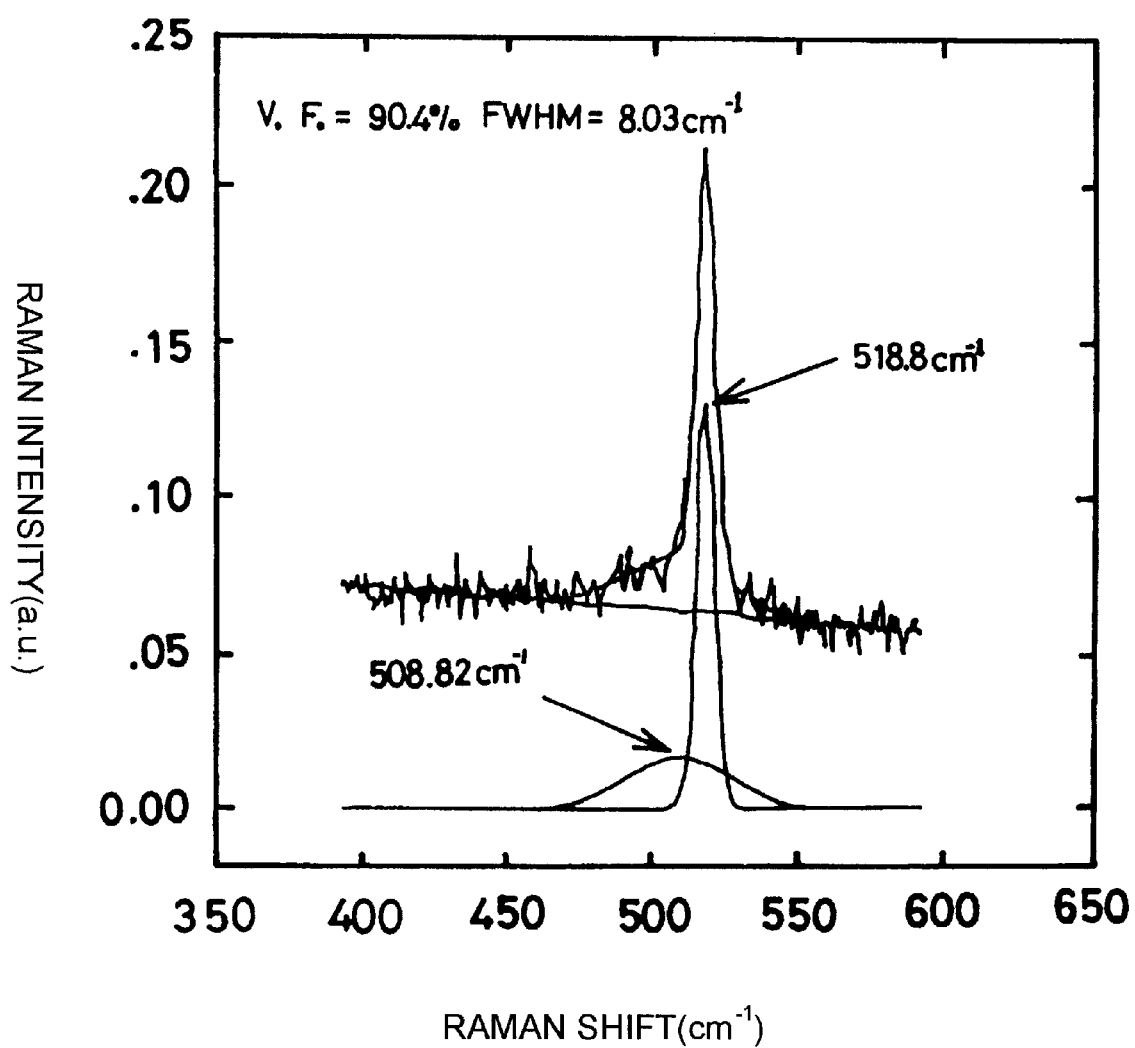
FIG. 7 is a Raman spectrum of a polycrystalline silicon film crystallized in accordance with the present invention.

FIG. 7 shows a Raman spectrum of a polycrystalline silicon film crystallized according to the present invention, wherein thermal treatment was conducted at 500° C. for 10 minutes while applying an electric field of 300 V/cm to amorphous silicon. As shown in FIG. 7, there are no peaks at 480 $cm^{-1}$ and a maximum peak at 520 $cm^{-1}$. As a result, the amorphous phase has disappeared and the crystalline phase has appeared. Namely, amorphous silicon is crystallized to form polysilicon by the present invention.

Figure 8:
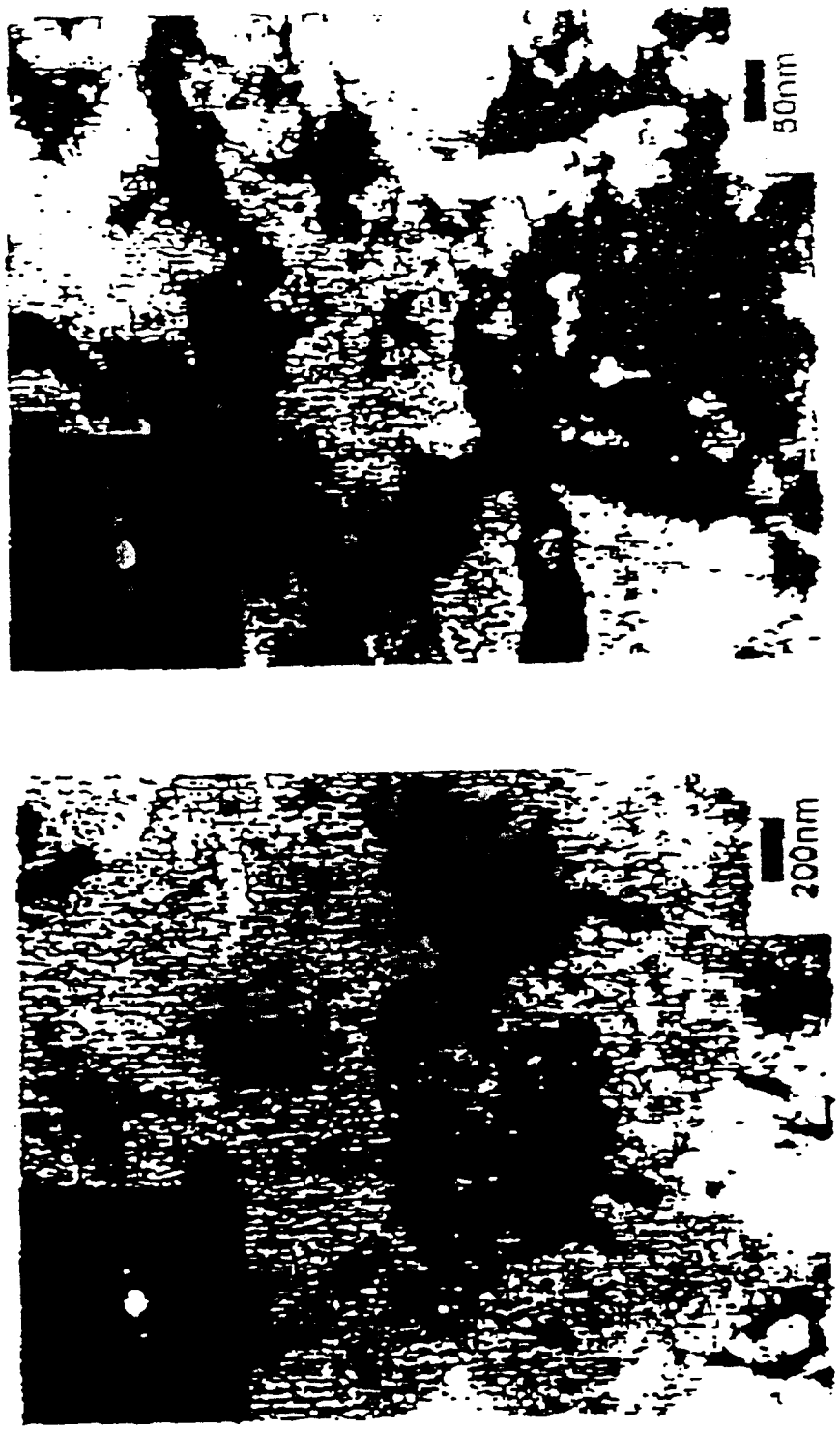
FIG. 8 is a TEM picture of a polycrystalline silicon film crystallized in accordance with the present invention.

FIG. 8 shows a TEM picture of a polycrystalline silicon film crystallized according to the present invention, wherein thermal treatment was conducted for 10 minutes while applying an electric field of 300 V/cm to amorphous silicon, in the direction of <111>. The TEM picture reveals no evidence of amorphous phase silicon and silicon has grown in the direction of <111>.

Figure 9:
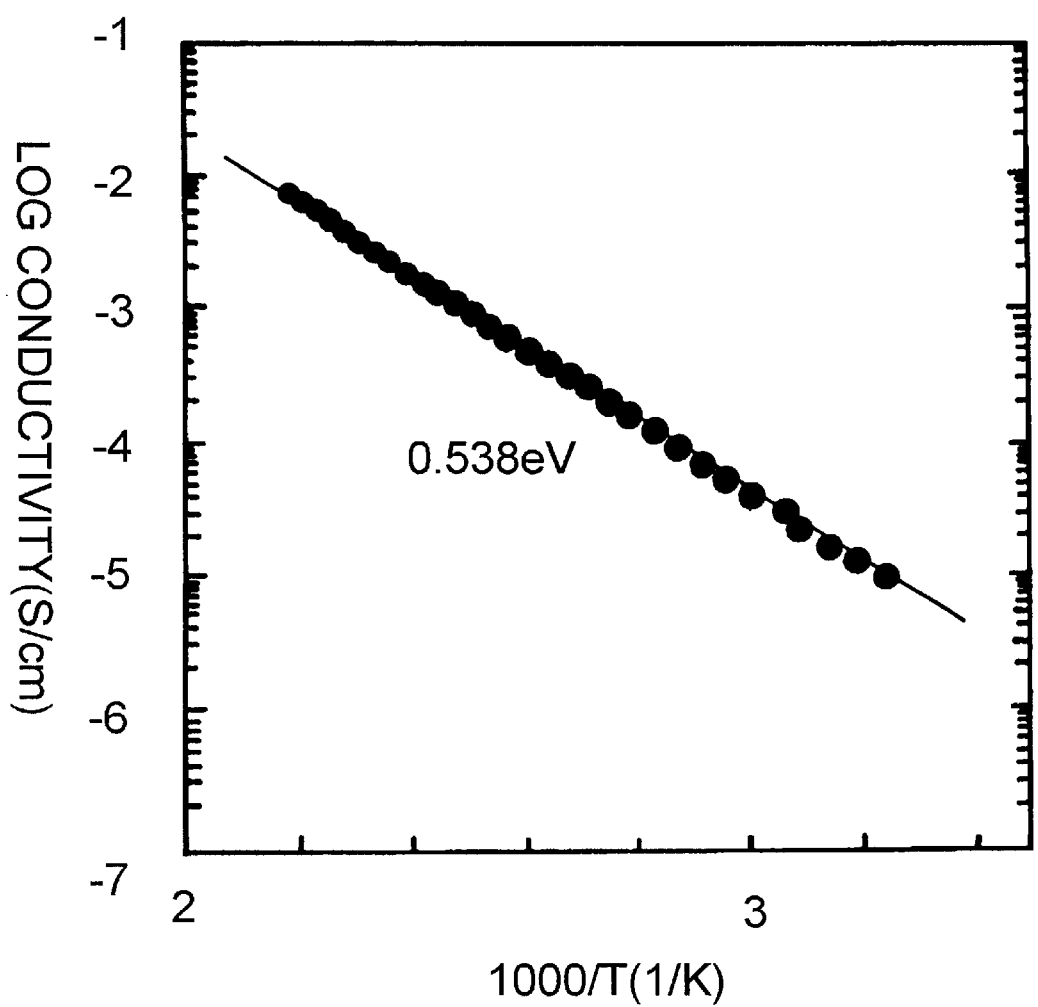
FIG. 9 is a graph of the relationship of the electrical conductivity to temperature of a polycrystalline film crystallized in accordance with the present invention.

FIG. 9 shows a graph of the electrical conductivity of a polycrystalline silicon film crystallized according to the present invention, wherein thermal treatment was conducted for 10 minutes while applying an electric field of 300 V/cm to amorphous silicon. The activation energy attained by the slope of the straight line is 0.538 eV, which is the same value as that attained from fine polycrystalline silicon Considering the results shown in FIG. 7 to FIG. 9, the method of the present invention produces excellent polysilicon films.

The present invention may be applied to any structure by forming a metal layer on an amorphous film and by forming an electric field in the amorphous silicon film during crystallization. In this regard, there are various suitable methods of applying an electric field to an amorphous film. For example, such methods would include forming first and second electrodes on the amorphous film and then applying an electric field between the first and second electrodes; applying an electric field between the first and second electrodes by contacting the first and second electrodes with each end of the amorphous film, respectively; or locating the amorphous film between the first and second electrodes, wherein the amorphous film has no contact with the electrodes.

Although the present invention is exemplified by the crystallization of amorphous silicon, the present invention can be applied to other amorphous groups such as amorphous Si-carbon, amorphous Si-germanium, amorphous Si-nitrogen and the like. Moreover, the present invention can also be applied to any amorphous material for crystallization.

The present invention provides a method of crystallizing an amorphous film by forming electrodes on an amorphous film, forming a metal layer connected to the electrodes and subjecting the amorphous film to thermal treatment while simultaneously applying an electric field to the amorphous film, thereby increasing the speed of crystallization and reducing processing time. Moreover, the present invention eliminates metal contamination caused by crystallization using a metal. In the present invention, the amorphous silicon is crystallized by using the very thin metal layer, for example, nickel layer.

Figure 10:
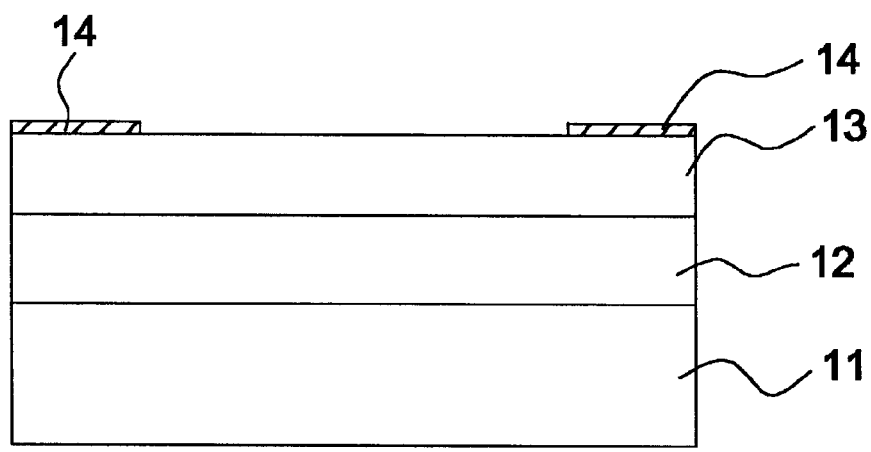
FIG. 10 shows a fourth embodiment of crystallizing an amorphous film according to the present invention, prior to crystallization.
Figure 11:
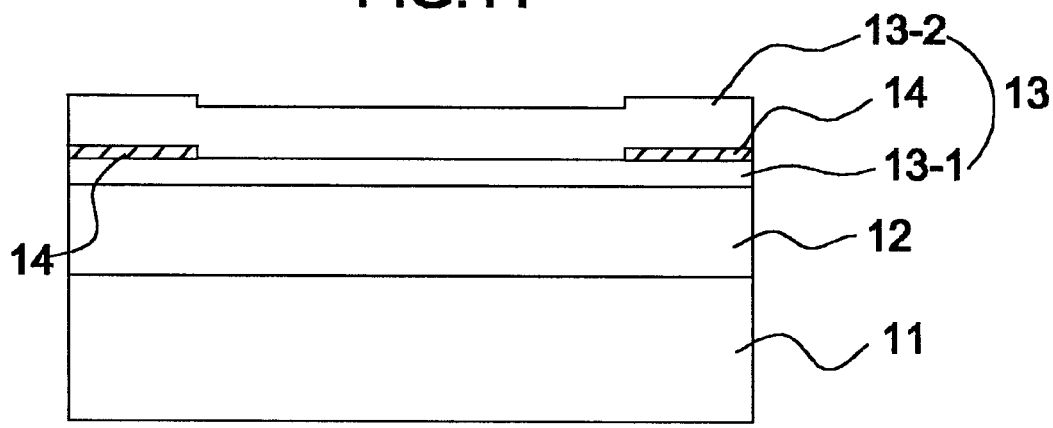
FIG. 11 shows a fifth embodiment of crystallizing an amorphous film according to the present invention, prior to crystallization.
Figure 12:
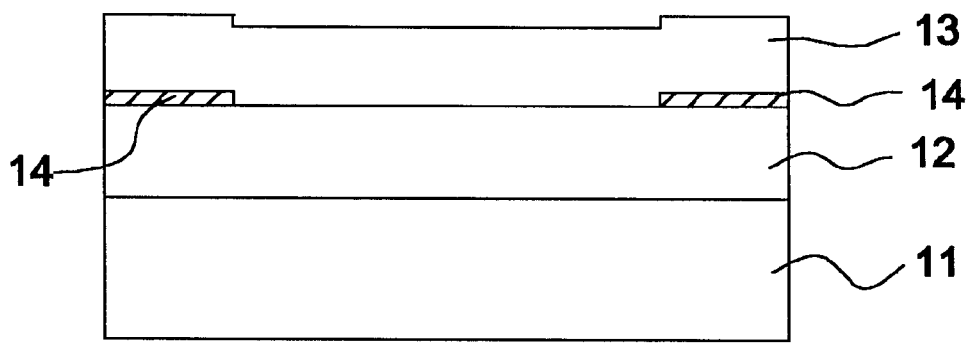
FIG. 12 shows a sixth embodiment of crystallizing an amorphous film according to the present invention, prior to crystallization.
Figure 13:
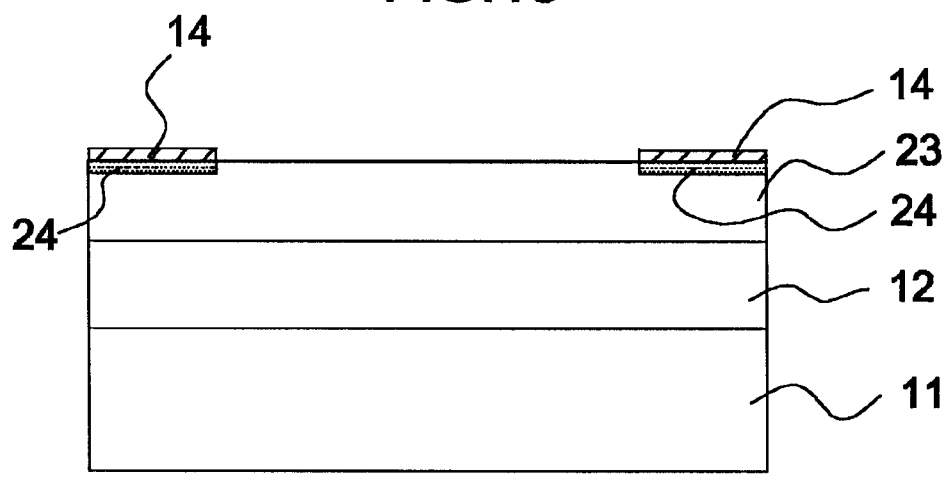
FIG. 13 is a cross-sectional view of the result of the FIG. 10 preferred embodiment of crystallizing an amorphous film according to the present invention.
Figure 14:
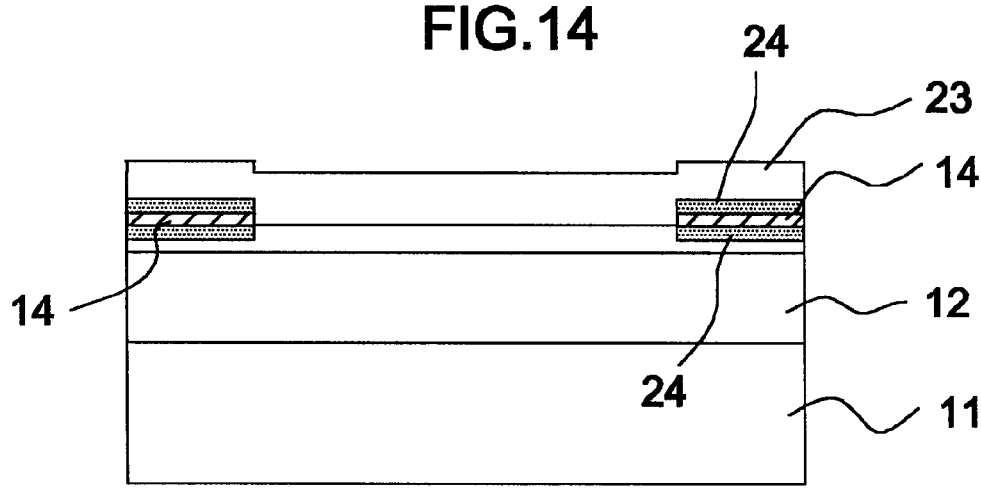
FIG. 14 is a cross-sectional view of the result of the FIG. 11 preferred embodiment of crystallizing an amorphous film according to the present invention.
Figure 15:
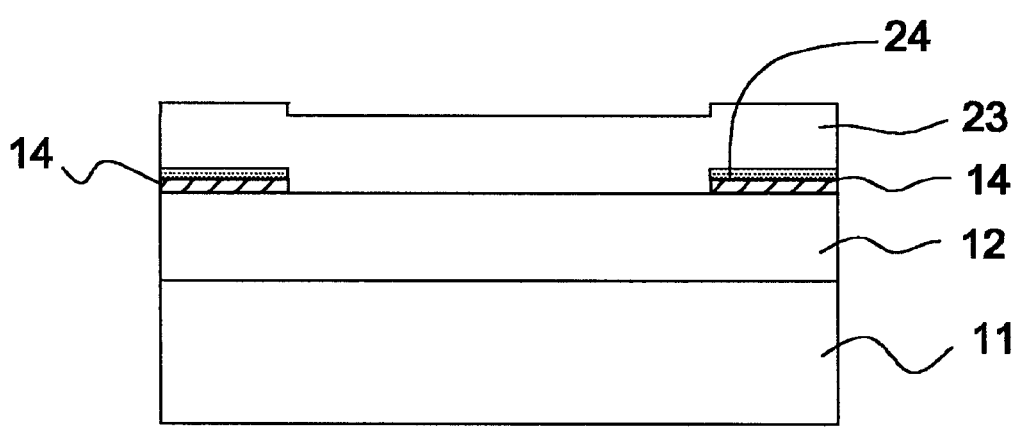
FIG. 15 is a cross-sectional view of the result of the FIG. 8 preferred embodiment of crystallizing an amorphous film according to the present invention.

The following embodiments illustrate crystallizing amorphous films by applying voltage to nickel electrodes in order to demonstrate methods of crystallizing amorphous films according to the present invention. Three embodiments are described, with the nickel electrodes positioned differently with respect to layers of amorphous silicon. FIG. 10 to FIG. 12 are cross-sectional views of the first to third embodiments before applying an electric field to nickel electrodes. FIG. 13 to FIG. 15 show the results, respectively, of crystallization of the amorphous films of FIG. 10 to FIG. 12 by thermal treatment while applying an electric field to the nickel electrodes.

FIG. 10 is a cross-sectional view of an amorphous silicon film which is made by forming nickel electrodes 14 on each end of the top surface of an amorphous silicon film 13 after the amorphous silicon film 13 has been formed on an insulating substrate 11. Quartz, glass, or oxide is used as the insulating substrate 11. As shown in FIG. 1, a buffer layer 12 is preferably provided between the insulating substrate 11 and the amorphous silicon film 13 to prevent impurities of the insulating substrate 11 from diffusing into the amorphous silicon film 13 during the heat treatment process used to crystallize the amorphous silicon film. Generally, buffer layer 12 is silicon oxide, whether in the embodiments in accordance with FIG. 6 or in accordance with the embodiments of FIGS. 11 and 12.

FIG. 11 is a cross-sectional view of an amorphous silicon film 13 which is made by depositing a buffer layer 12 on an insulating substrate 11, depositing a first amorphous silicon film 13-1 on the buffer layer 12, forming nickel electrodes 14 on the first amorphous film 13-1 and depositing a second amorphous silicon film 13-2 on the first amorphous film 13-1, so that the second amorphous silicon film 13-2 covers the surfaces of the nickel electrodes 14. Together the first and second amorphous films constitute an amorphous film 13. In other words, the nickel electrodes 14 are arranged within the amorphous silicon film 13.

FIG. 12 is a cross-sectional view of an amorphous film 13 made by depositing a buffer layer 12 on an insulating substrate 11, forming nickel electrodes 14 on each end of a top surface of the buffer layer 12 and depositing an amorphous silicon film 13 over the nickel electrodes 14 and the exposed portion of the buffer layer 12.

In the above methods, the amorphous films may be formed by any one of PECVD (Plasma Enhanced Chemical Vapor Deposition), CVD (Chemical Vapor Deposition), sputtering, or the like, wherein the amorphous silicon film is deposited to a thickness of 100 to 100,000 Å. More particularly, 100 to 100,000 Å is desirable for the thickness of deposition.

A nickel layer can be formed by any one of the known methods of coating with nickel including for example conventional sputtering, deposition from a solution, or plasma deposition, to a thickness of 0.001 to 2 Å. The nickel layer is then etched by photolithography or similar method to form the nickel electrodes, wherein the distance between the electrodes if 0.0001 to 500 cm, desirably 0.01 to 100 cm, and more desirably 1 to 50 cm.

Thermal treatment is applied to the above-described substrate for 1 to 20 minutes, at a temperature between 300 to 800° C. and in an atmosphere of nitrogen gas or a vacuum, and with a voltage between the nickel electrodes ranging from 1 to 1,000,000 V, more desirably 10 to 10,000 V, forming a crystallized silicon film. In this case, the voltage applied between the two nickel electrodes may be arranged to vary over time. When forming an electric field in the amorphous film, plasma may exist in the chamber adjacent the amorphous film.

FIG. 13 to FIG. 15 show the results of crystallizing of the amorphous films shown in FIG. 10 to FIG. 12, respectively, employing thermal treatment while applying an electric field to the nickel electrodes. FIG. 13 is the result of crystallizing the amorphous silicon of the first preferred embodiment shown in FIG. 10. FIG. 14 is the result of crystallizing the amorphous silicon of the second preferred embodiment shown in FIG. 11. FIG. 15 is the result of crystallizing the amorphous silicon of the third preferred embodiment shown in FIG. 12.

Referring to FIG. 13, a cross-sectional view of the result of the first preferred embodiment, a crystallized silicon film 23 lies on the buffer layer 12 on the insulating substrate 11. A nickel-silicide layer 24 is formed on the portion of the silicon layer adjacent the nickel electrodes 14. Namely, nickel-silicide 24 is formed where the nickel electrodes 14 were in contact with the amorphous silicon. Moreover, the heat and electric field crystallizes the silicon layer 23 from the amorphous film previously extending between the nickel electrodes. Amorphous silicon and nickel in contact with the amorphous silicon form nickel-silicide 24, after which the lower layer of amorphous silicon is crystallized into $NiSi_2$, the lowest energy phase of nickel-silicide. The individual nickel-silicide crystallites act as nucleation sites for the crystallization of the amorphous silicon. The speed of crystallization of the amorphous silicon film increases and the temperature of crystallization of the amorphous silicon film decreases by applying an electric field across the amorphous silicon film during at least a part of the thermal treatment. According to particularly preferred aspects of the present invention, an amorphous silicon film may be crystallized by thermal treatment at a low temperature of between 300 to 800° C. for a duration of between about 1 to 20 minutes.

Referring to FIG. 14, a cross-sectional view of the result of the second preferred embodiment, a crystallized silicon film 23 lies on the buffer layer 12 on the insulating substrate 11. Nickel-silicide layer 24 is formed on the portion of silicon in contact with nickel electrodes 14. In this preferred embodiment of the invention, nickel-silicide is formed at the interfaces between the nickel electrodes 14 and the upper and lower layers of amorphous silicon, 13-1 and 13-2 respectively. That is, nickel-silicide 24 is formed where the nickel electrodes 14 contacted the amorphous silicon. Additionally, the thermal treatment and the applied electric field crystallize the amorphous film to form the silicon layer 23 extending between the nickel electrodes. Amorphous silicon and nickel in contact therewith initially form nickel-silicide 24. The heat treatment progresses and the lower and upper layers of the amorphous silicon are crystallized by the presence of the $NiSi_2$, which is the lowest energy phase of nickel-silicide and nucleates the crystallization. Beginning from the nucleated crystals adjacent the electrodes, the crystallization front extends away from the electrodes to span the separation between the electrodes as the heat treatment progresses. Those of ordinary skill will appreciate that the general progress of the crystallization process is similar for the other embodiments. Also as with the other embodiments, the speed of crystallization of the amorphous silicon film increases and the temperature of crystallization decreases in response to the presence of the electric field across the amorphous silicon film while conducting thermal treatment.

Referring to FIG. 15, a cross-sectional view of the result of the third preferred embodiment, a crystallized silicon film 23 lies on the buffer layer 12 on the insulating substrate 11. Nickel-silicide layer 24 is formed on the portion of amorphous silicon which contacted nickel electrodes 14. Namely, nickel-silicide 24 is formed adjacent where the nickel electrodes 14 and the silicon in contact therewith and silicon layer 23 has been crystallized from the amorphous film between the nickel electrodes. Amorphous silicon and nickel in contact with the amorphous silicon form nickel-silicide 24, after which the upper layer of amorphous silicon is crystallized through its contact with the previously formed $NiSi_2$, which acts to nucleate the crystallization process adjacent the electrodes. As with the other discussed embodiments, the speed of crystallization of the amorphous silicon film increases and the temperature of crystallization decreases.

The above preferred embodiments of the invention illustrate nickel-silicide 24 formed at the original contact area between the nickel electrodes 14 and that portion of the silicon in immediate contact therewith. After thermal treatment, the polycrystalline silicon film 23 crystallized from the original amorphous silicon extends between the two nickel electrodes.

As explained in the preferred embodiments of the invention, amorphous silicon and nickel in contact therewith form nickel-silicide. Amorphous silicon is crystallized by $NiSi_2$, which is the lowest energy phase of nickel-silicide and works as a nucleus for crystallization. In this case, the amorphous silicon film is crystallized in an even shorter time by applying an electric field across the amorphous silicon film during crystallization. More specifically, in accordance with the present invention, the amorphous silicon film may be crystallized by thermal treatment at a low temperature of between 300 to 800° C. for 1 to 20 minutes.

The present invention may be applied to the crystallization of amorphous silicon including impurities such as oxygen, nitrogen, carbon and the like, which have concentrations under $10^{22}/cm^3$.

Although nickel electrodes are used in the preferred embodiments of the invention, another metal such as a transition metal or an alloy of a transition metal may be used as the electrodes. Moreover, each of the electrodes 14 on the silicon layer may be formed with a different metal. Additionally, the electrodes may comprise more than one layer.

Cross-sectional views of the nickel electrodes in contact with the amorphous silicon film are shown in the above preferred embodiments of the invention. However, the present invention may be applied to any electrode structure forming an electric field on the amorphous silicon film. Thus, the cross-sectional shape of the electrodes may be any geometric shape, such as rectangular and the like. The shape of the electrode is not critical, as long as the shape of the electrode permits applying an electric field to the amorphous silicon film. Moreover, for the same reason, the location or size of the electrodes is not critical and may vary widely. In this regard, the electrodes may be formed to apply an electric field to the amorphous film either vertically or horizontally.

Figure 16:
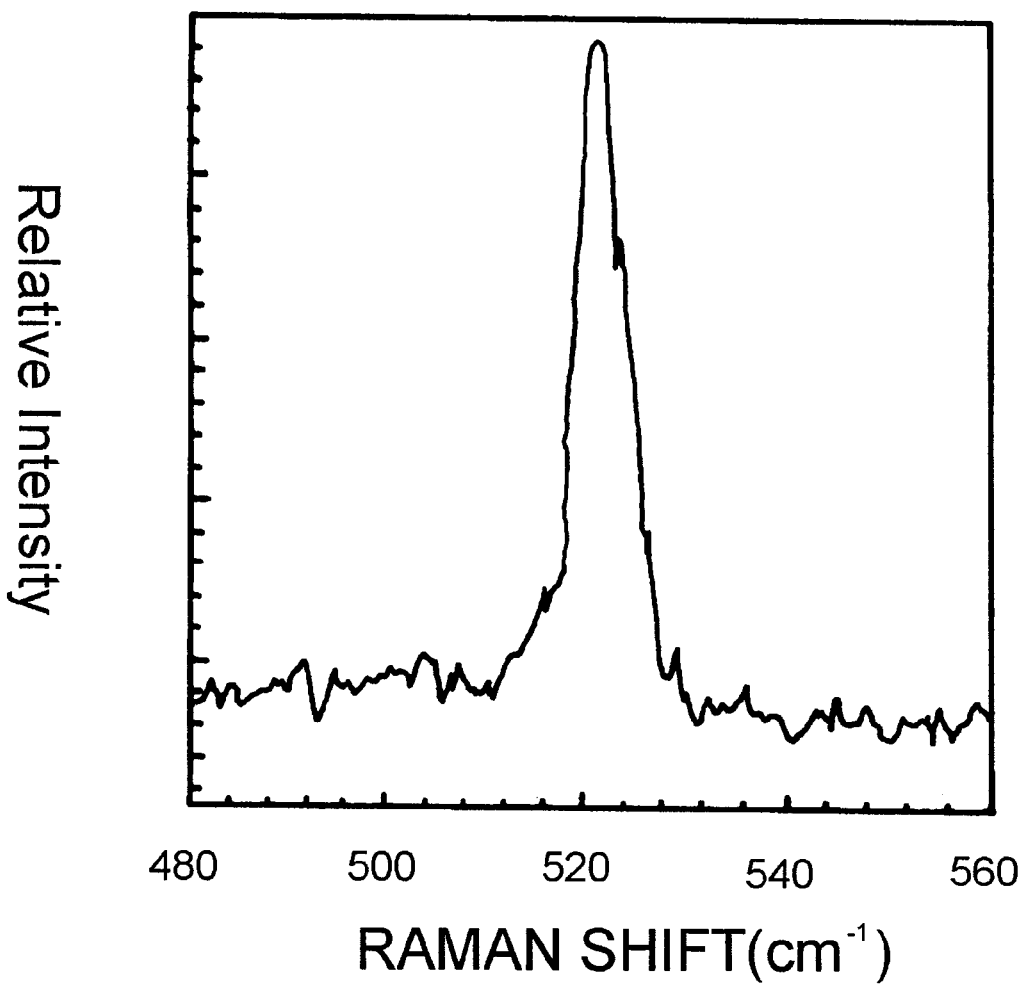
FIG. 16 is a Raman spectrum of a polycrystalline silicon film crystallized in accordance with the present invention.

FIG. 16 shows a Raman spectrum of a polycrystalline silicon film crystallized according to the present invention, wherein thermal treatment was conducted at 500° C. for 10 minutes while applying an electric field of 300 V/cm to a layer of amorphous silicon. As shown in FIG. 16, there are no peaks at 480 cm$^{-1}$ and a maximum peak at 520 cm$^{-1}$. It is consequently apparent that the amorphous phase has disappeared and the crystalline phase, or more accurately the polycrystalline phase, has appeared and dominates the Raman spectrum. By practice of particularly preferred embodiments of the present invention, amorphous silicon may be completely crystallized.

Figure 17:
FIG. 17 is a TEM picture of a polycrystalline silicon film crystallized in accordance with the present invention.

FIG. 17 shows a TEM picture of a polycrystalline silicon film crystallized according to the present invention, wherein thermal treatment was conducted for 10 minutes while applying an electric field of 300 V/cm to the amorphous silicon, in the direction of <111>. The TEM picture reveals no evidence of amorphous phase silicon and silicon has grown primarily in the <111> direction.

Figure 18:
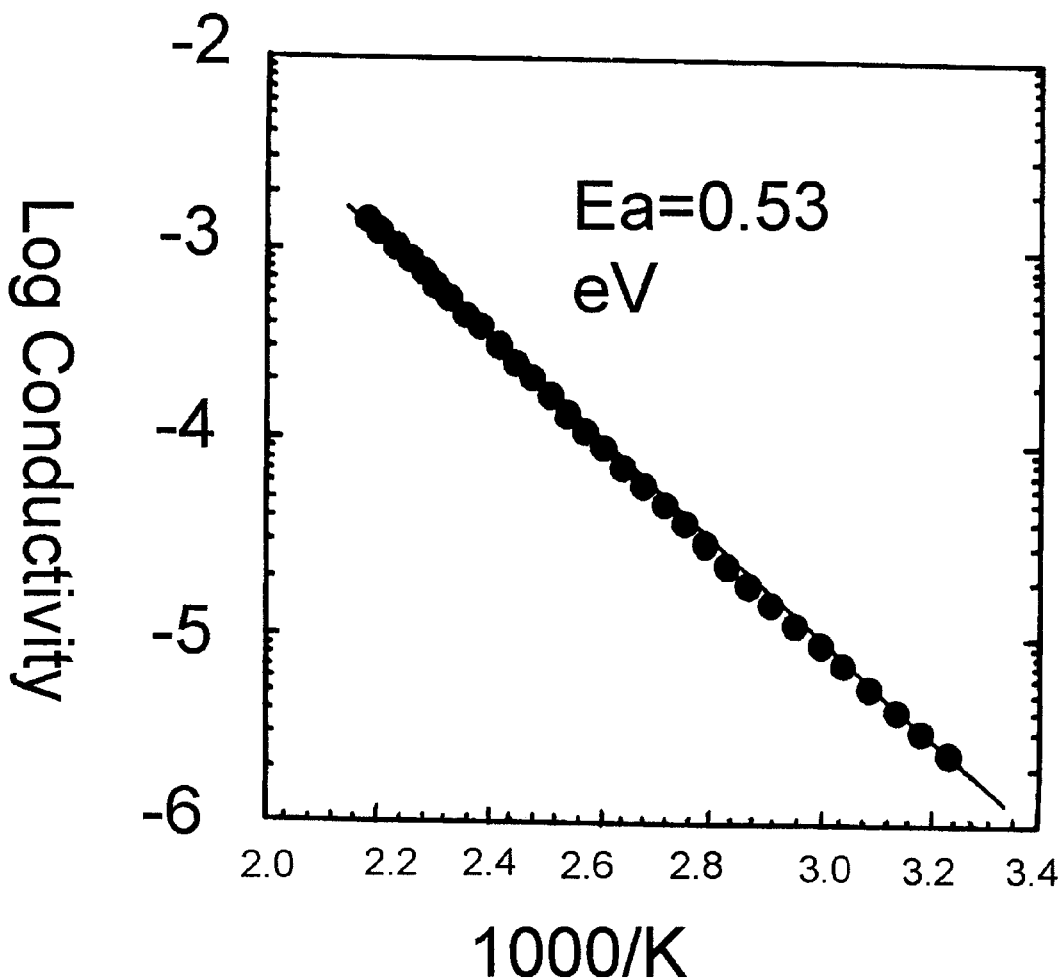
FIG. 18 is a graph of the relationship of the electrical conductivity to the temperature at which a polycrystalline film is crystallized in accordance with the present invention.

FIG. 18 shows a graph of the electrical conductivity of a polycrystalline silicon film crystallized according to the present invention, wherein thermal treatment was conducted for 10 minutes while applying an electric field of 300 V/cm to amorphous silicon. The activation energy attained by the slope of the straight line is 0.53 eV, which is the same value as that attained from fine polycrystalline silicon.

Considering the results shown in FIG. 16 to FIG. 18, methods in accordance with preferred embodiments of the present invention produce excellent crystallization.

The present invention may be applied to any structure by forming an electric field on an amorphous silicon film during crystal growth. In this regard, there are various methods of applying an electric field to an amorphous film. For example, such methods would include forming a first and second electrode on the amorphous film and then applying an electric field between the first and second electrode; applying an electric field between the first and second electrode by contacting the first and second electrode with each end of the amorphous film, respectively; or locating the amorphous film between the first and second electrode, wherein the amorphous film has no physical contact with the electrodes.

Although the present invention is exemplified by the crystallization of amorphous silicon, the present invention can be applied to other amorphous groups such as amorphous Si-carbon, amorphous Si-germanium, amorphous Si-nitrogen and the like. Moreover, the present invention can also be applied to any amorphous material for crystallization.

The present invention provides a method of crystallizing an amorphous film by subjecting the amorphous film to thermal treatment while simultaneously applying an electric field to the amorphous film, thereby increasing the speed of crystallization and reducing processing time. Moreover, the present invention eliminates metal contamination caused by crystallization using metal.

Figure 19:
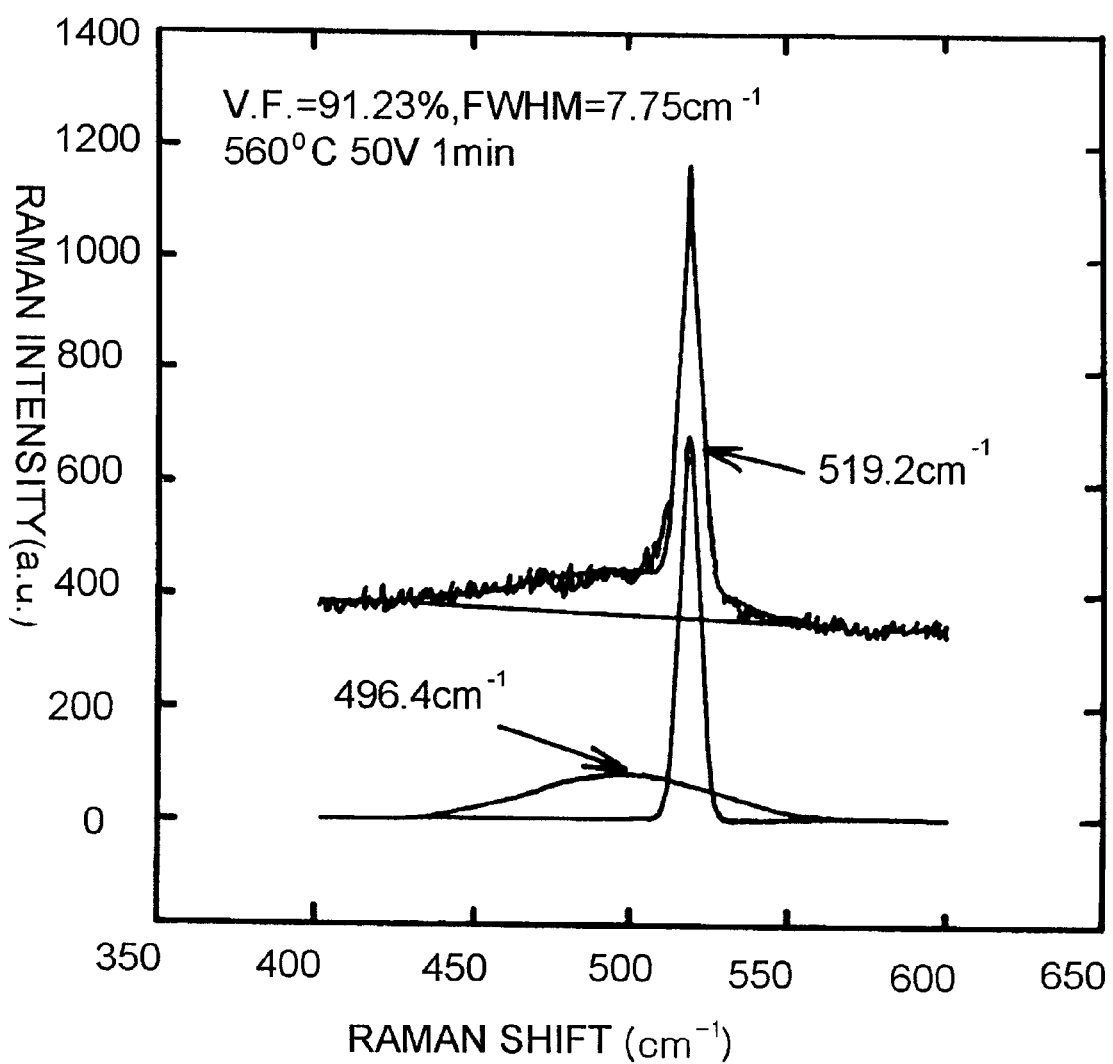
FIG. 19 is another Raman spectrum of a polycrystalline silicon film crystallized in accordance with the present invention.

FIG. 19 shows a Raman spectrum of a polysilicon film crystalized by thermal treatment for 1 minute on applying a voltage of 50V to an amorphous silicon film under a temperature of about 560° C. according to the present invention. As shown in FIG. 19, there is a peak portion at the 519 cm$^{-1}$ mark. As a result, the amorphous silicon has completed its crystallization in 1 minute. Accordingly, in the present invention, no more than 1 minute is needed to crystallize an amorphous silicon at a temperature of, for example, 600° C. or more.

Figure 20:
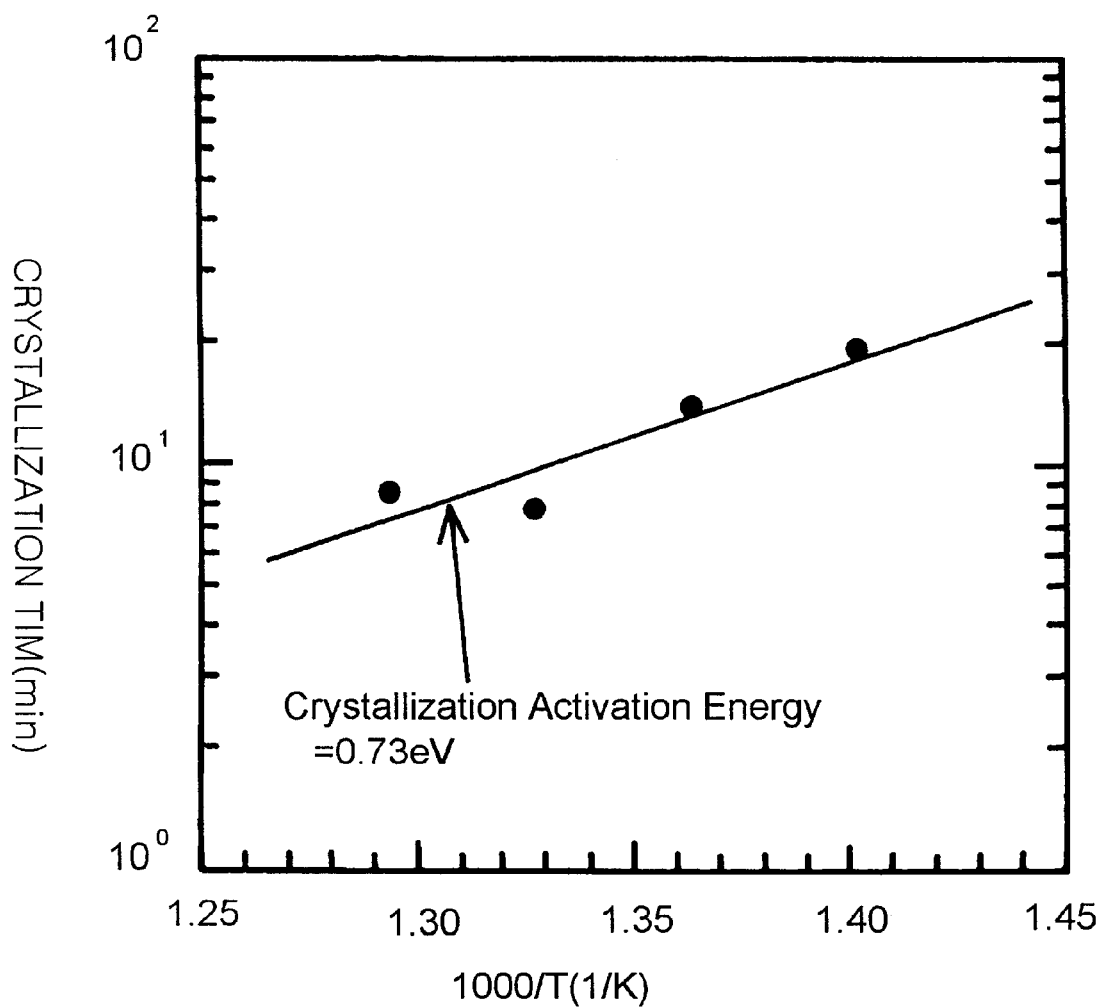
FIG. 20 is a graph showing the annealing temperature vs. crystallization time in accordance with the present invention.

FIG. 20 shows a graph of annealing temperature vs. crystallization time according to the present invention under a thermal environment with an electric field of about 100V/cm. Here, the amorphous silicon film sample had a dimension of 2.54 cm×2.54 cm with a 0.03 Å thickness of Ni deposited on the amorphous silicon. As shown in FIG. 20, crystallization time is inversely proportional to the annealing temperature. Therefore, a higher annealing temperature requires less crystallization time.

Figure 21:
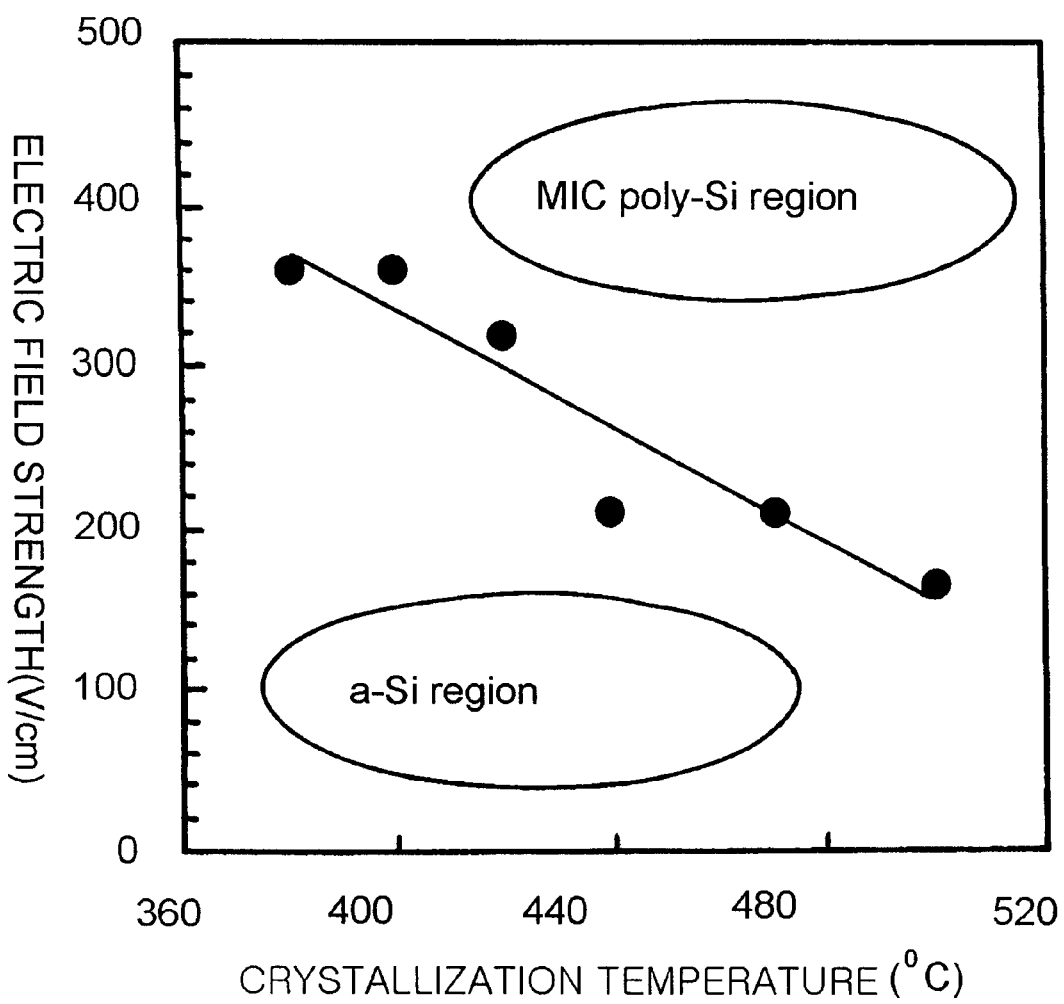
FIG. 21 is a graph showing the crystallization temperature vs. electric field strength in accordance with the present invention.

FIG. 21 shows a graph of crystallization temperature vs. electric field strength according to the present invention where thermal temperature is applied for about 10 minutes. In accordance with the present invention, by increasing the electric field strength, the crystallization temperature may be reduced. Therefore, a substantially the same crystallization effect can be achieved with a low crystallization temperature (annealing temperature) by increasing electric field strength.

Figure 22:
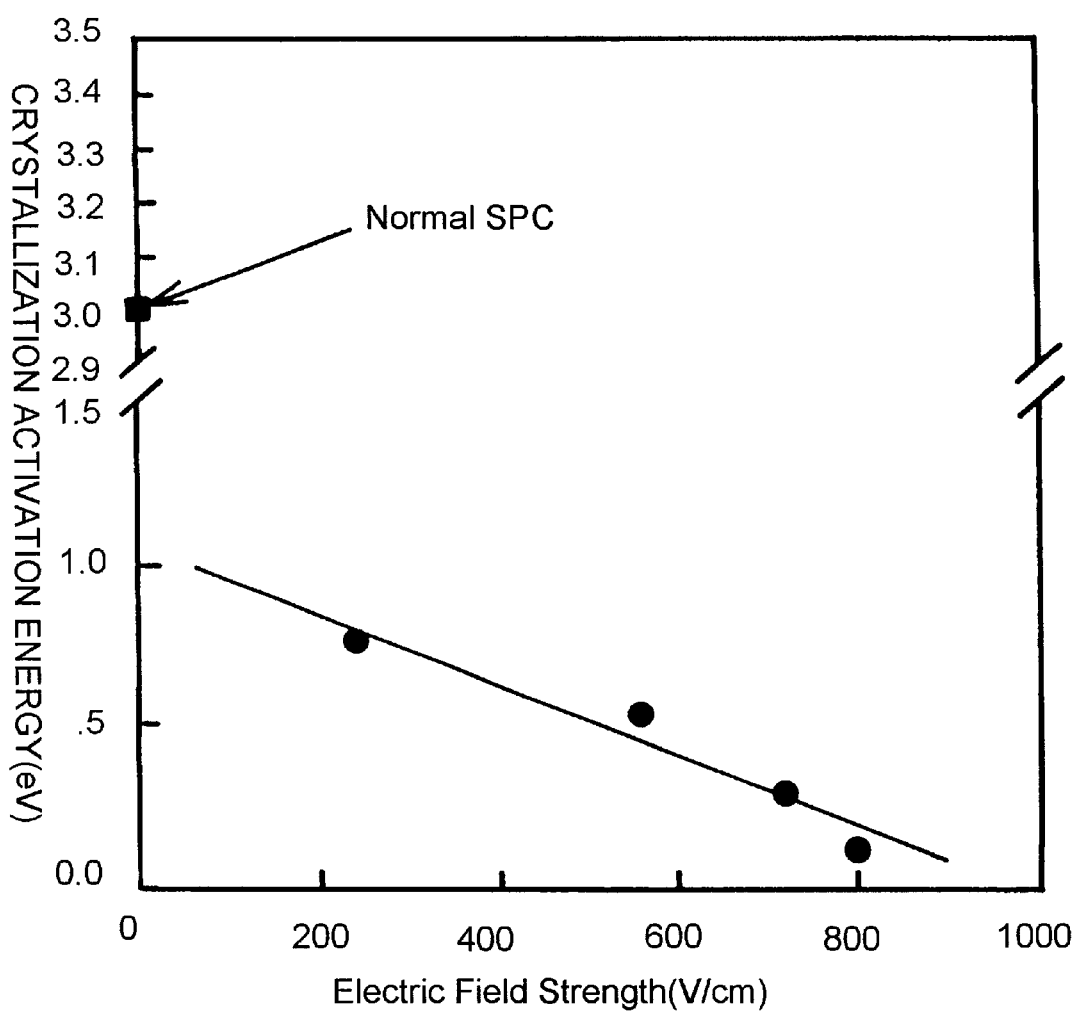
FIG. 22 is a graph showing the electric field strength vs. crystallization activation energy in accordance with the present invention.

FIG. 22 shows a graph of electric field strength vs. crystallization activation energy according to the present invention where thermal temperature is applied for about 10 minutes. Here, Ni was applied at a thickness of, for example, about 0.01 Å. According to the present invention, crystallization activation energy can be calculated by using the following equation.

$$r_g = D \cdot \exp\left(-\frac{\Delta G}{kT}\right)$$

where D is PnVf (P is probability of atomic jump, n is an interface atomic density, V is vibrational frequency, f is a filling fraction of atoms), $\Delta G$ is the energy barrier height, k is a constant, and T is temperature. This equation is explained in more detail in relevant technical papers such as "Solid Phase Crystallization of Thin Films of Si Prepared by Plasma-enhanced Chemical Vapor Deposition," by Y. Masaki et al.,. J. Appl. Phys. 74 (1), Jul. 1, 1993, which is hereby incorporated by reference. Thus, as the electric field strength increases, the crystallization activation energy is reduced. Therefore, crystallization could be made faster by increasing the electric field strength.

Figure 23A:
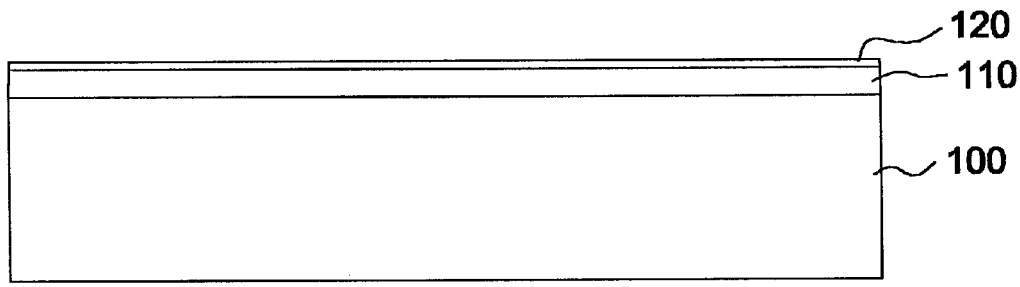
FIGS. 23A–23G show a process of forming an embodiment of the thin film transistor in accordance with the present invention.
Figure 23B:
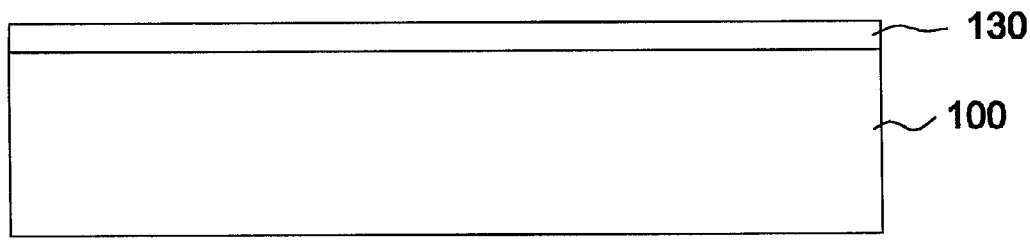
Figure 23C:
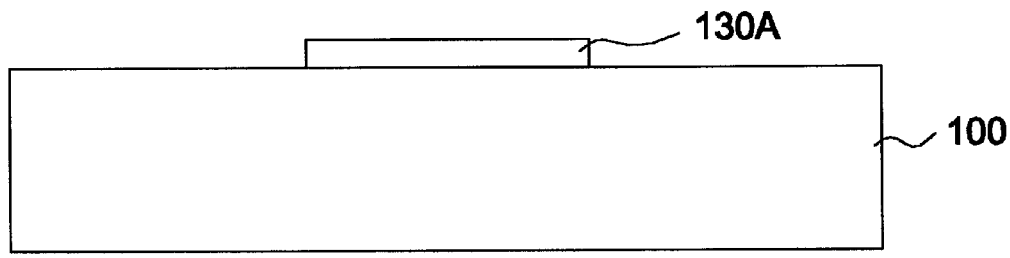
Figure 23D:
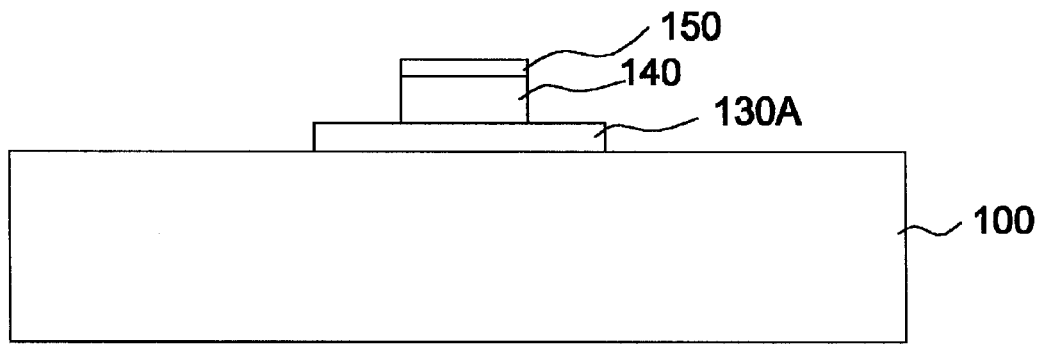
Figure 23E:
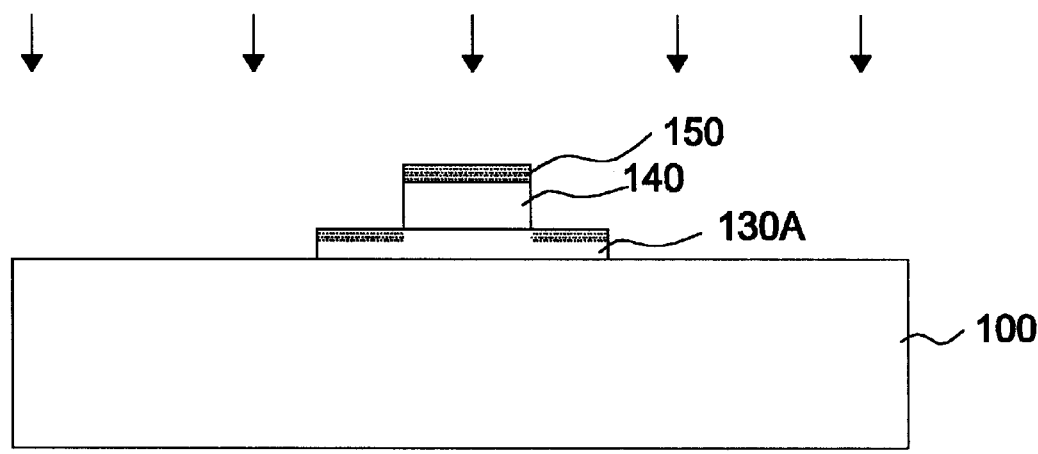
Figure 23F:
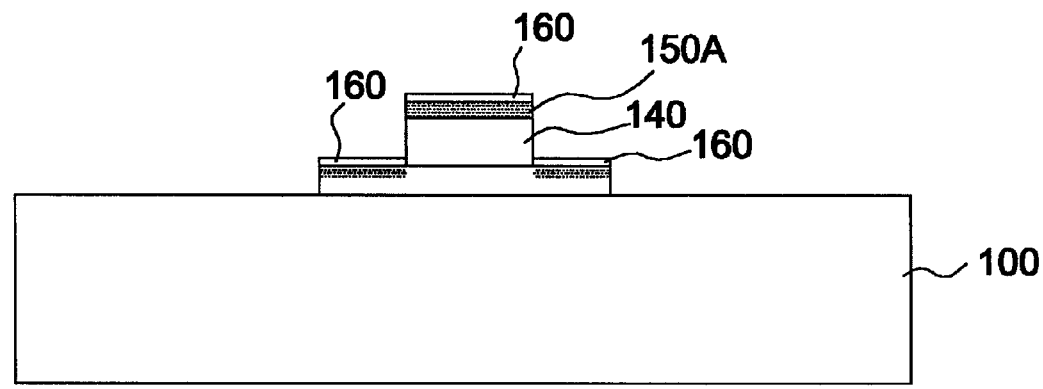
Figure 23G:
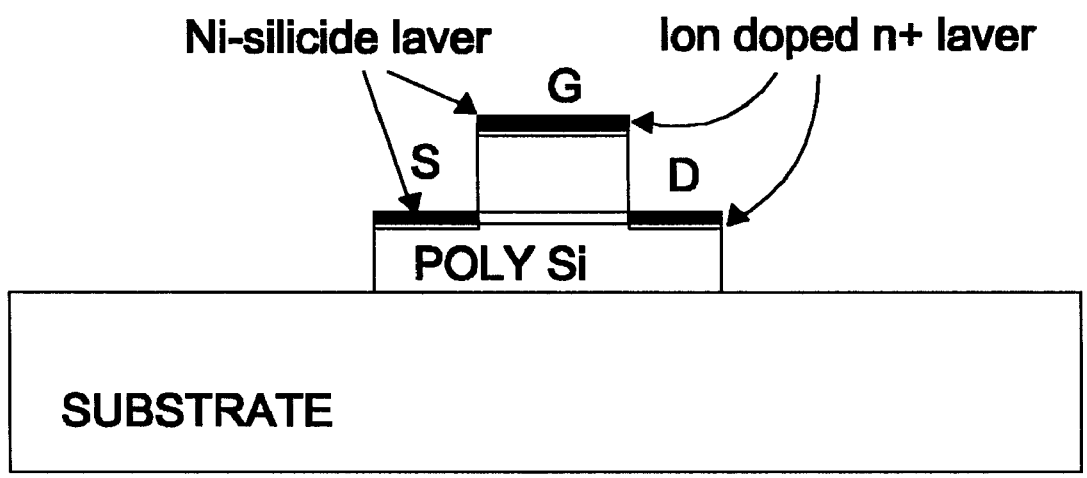

FIG. 23G shows a cross-sectional view of the thin film transistor according to the present invention. FIGS. 23A–23G shows the process of forming the thin film transistor of the present invention. In FIG. 23A, an amorphous silicon film 110 for an active layer of about 4,000 Å is formed on a substrate 100 such as glass. A metal layer 120 such as Ni of about 0.03 Å is formed on the amorphous silicon film 110. Then, a temperature of about 500° C. and an electric field of about 80 V/cm are applied for about 10 minutes to convert the amorphous silicon 120 into polysilicon 130, as shown in FIG. 23B. Then, the polysilicon 130 is patterned to form an active layer 130A, as shown in FIG. 23C. On the active layer 130A, an insulating layer 140 such as SiN of about 2500 Å and an amorphous silicon layer 150 for gate is formed. The resultant structure is doped with an n+ material, for example, at about $5 \times 10^{-16}$ cm$^{-2}$, as shown in FIG. 23E. After doping, an Ni layer 160 of about 200 Å is formed on the doped amorphous silicon layer 150 and the active layer 130A as shown in FIG. 23F. Then, annealing is performed for about one hour at a temperature of about 250° C. to form a Ni silicide layer, as shown in FIG. 23G.

Figure 24:
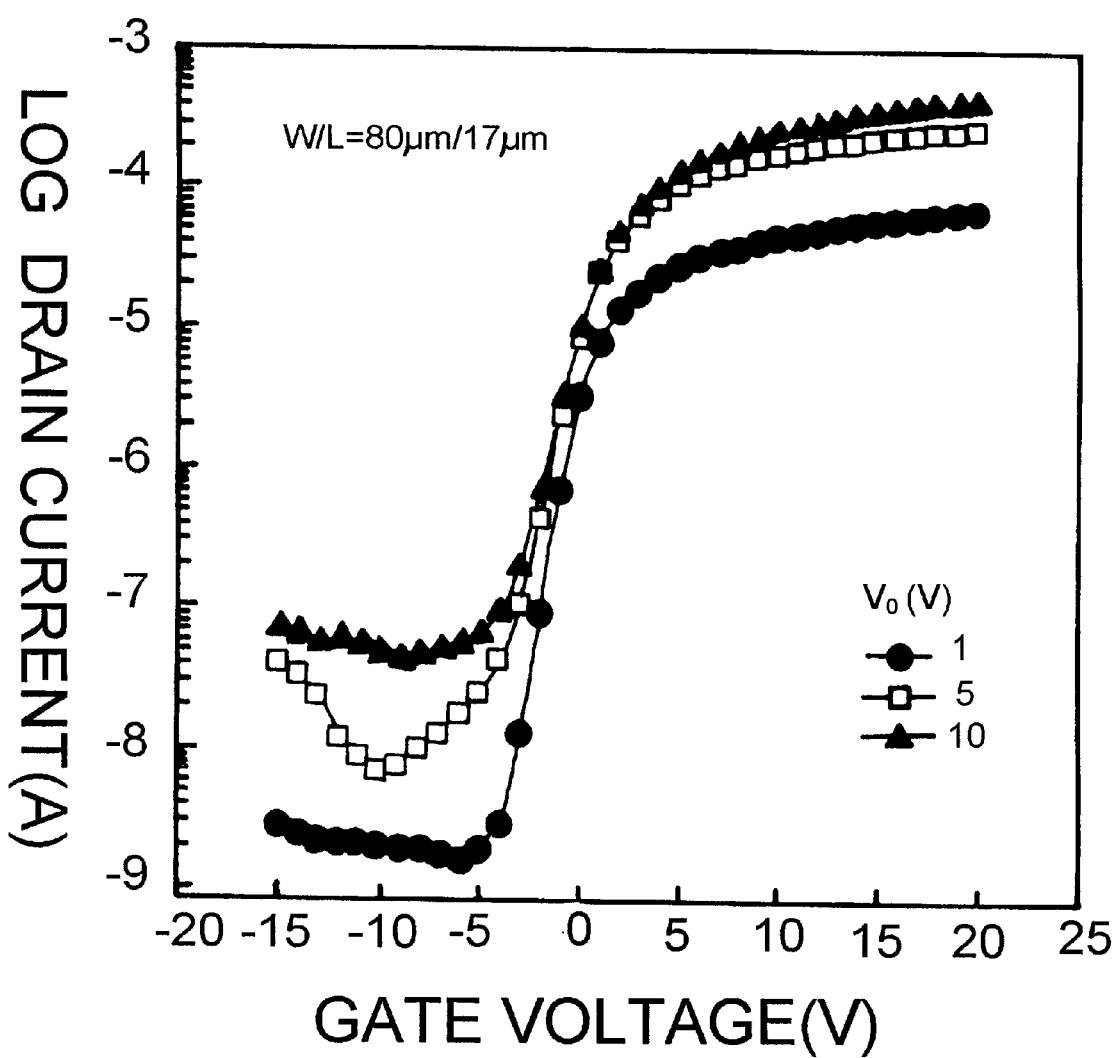
FIG. 24 shows a transfer characteristics curve showing gate voltage vs. drain current at various drain voltages in accordance with the present invention.
Figure 25:
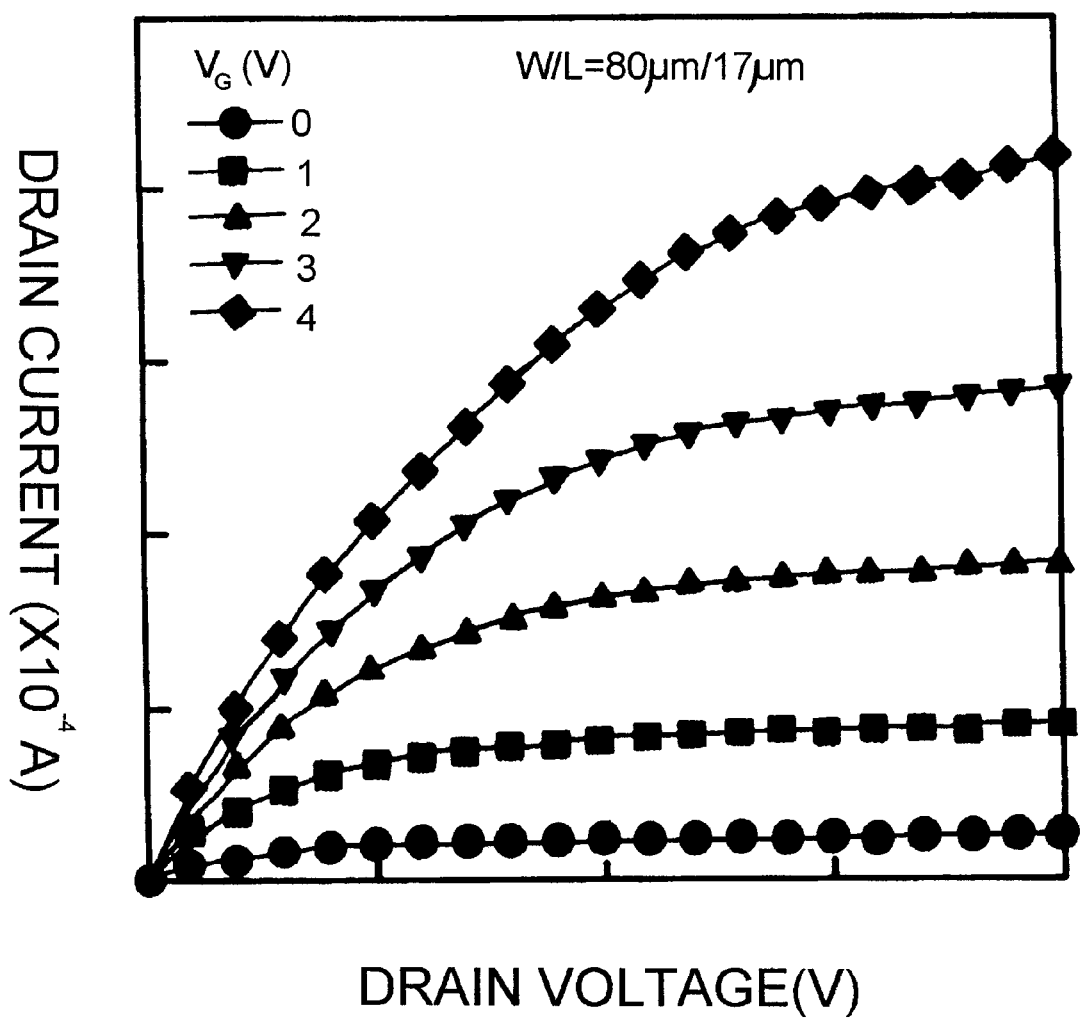
FIG. 25 shows an output characteristics curve showing drain voltage vs. drain current at various gate voltages in accordance with the present invention.
Figure 26:
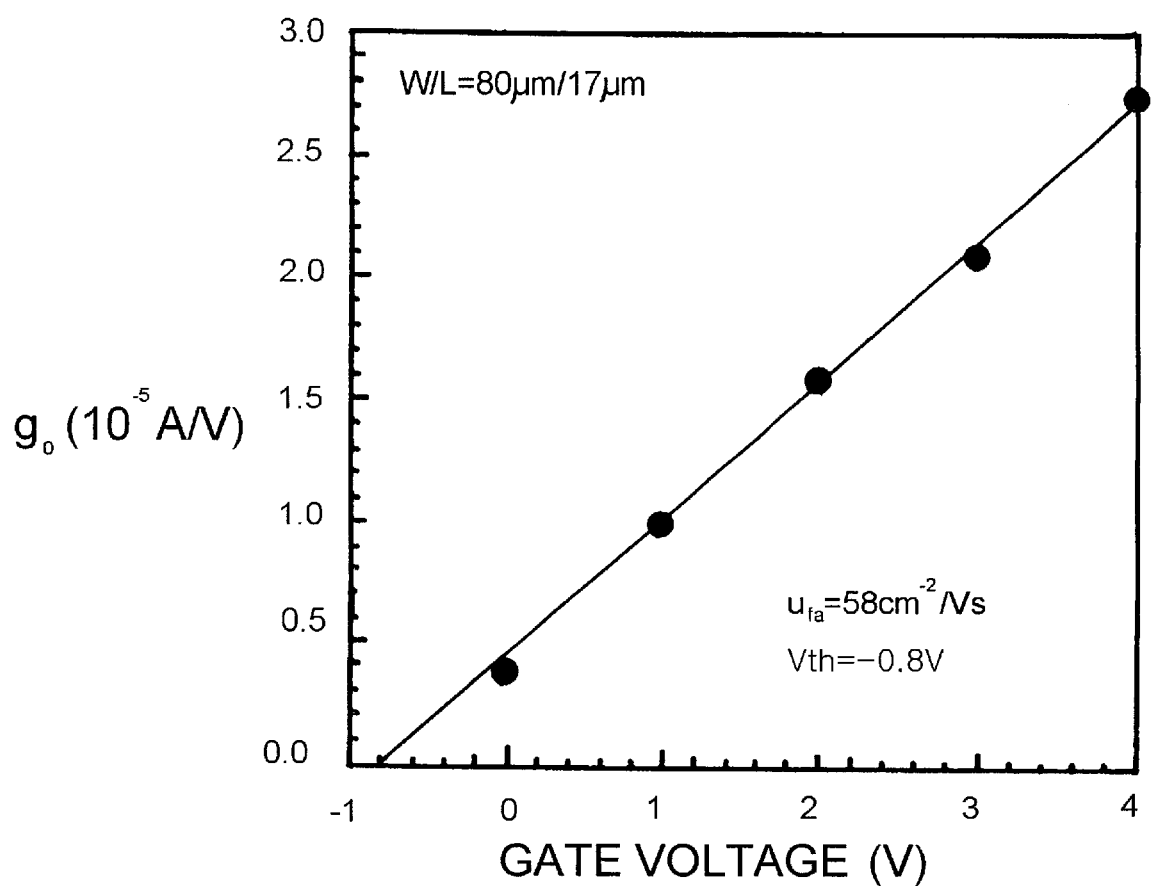
FIG. 26 shows a transconductance at various gate voltages in accordance with the present invention.

FIG. 24 to FIG. 26 show physical characteristics of the thin film transistor manufactured according to the present invention. In particular, FIG. 24 shows transfer characteristics curve showing gate voltage vs. drain current at various drain voltage. FIG. 25 shows output characteristics curve showing drain voltage vs drain current at various gate voltage. FIG. 26 shows a transconductance at various gate voltages. It shows the field effect mobility of 58 cm$^2$/Vs. The present invention can be employed in the fabrication of a poly silicon thin film transistor.

Accordingly, the present invention has following characteristics. In particular, for an MIC type of crystallization, electric field is applied with annealing to enhance the crystallization process in accordance with the present invention. The crystallization preferably occurs uniformly and at the same time on the entire amorphous silicon. Here, a metal such as Ni of about 0.001 to 2.0 Å may be on the entire surface of the amorphous silicon. Moreover, regardless of the size of the amorphous silicon, the rate of crystallization is the same. For example, an amorphous silicon having an area of 1 cm×1 cm will crystallize at substantially the same time as an amorphous silicon having an area of 100 cm×100 cm. The present inventors have experimented with a 30 cm×30 cm amorphous silicon in accordance with the present invention under about 500° C. Under these conditions, the amorphous silicon was crystallized after about 10 minutes. If higher temperature is used, such as 600° C., the crystallization occurs much faster. Accordingly, with the present invention, a large size amorphous silicon can be crystallized relatively quickly.

Also, in accordance with the present invention, the rate of crystallization is increased as higher electric field is applied. The mobility has also increased using the present invention.

The present invention can be employed in the fabrication of a thin film transistor for driving a liquid crystal display (LCD) and electric devices such as an SRAM, solar cell, etc.

It will be apparent to those skilled in the art that various modifications can be made in the method of crystallizing an amorphous film of the present invention without departing from the spirit or scope of the invention. Thus, it is intended that the present invention cover the modifications and variations of this invention provided they come within the scope of the appended claims and their equivalents.

What is claimed is:

1. A method of crystallizing an amorphous film comprising the steps of:
    forming an amorphous film capable of being crystallized on a substrate, the amorphous film being in contact with a metal layer;
    forming first and second electrodes on the amorphous film, the first and the second electrodes being separated by a distance ranging from about 0.0001 to 500 cm;
    forming an electric field between the first and second electrodes; and
    crystallizing the amorphous film by forming an electric filed in the amorphous film and the metal layer, while simultaneously subjecting the amorphous film and the metal layer to a thermal treatment, thereby crystallizing the amorphous film.

2. The method of crystallizing an amorphous film according to claim 1, further comprising the step of forming the metal layer between the first and second electrodes using plasma.

3. The method of crystallizing an amorphous film according to claim 1, further comprising the step of forming the metal layer between the first and second electrodes by applying a solution comprising a metal.

4. The method of crystallizing an amorphous film according to claim 1, wherein the step of forming the amorphous film comprises:
    forming an amorphous film on the substrate;
    forming the metal layer on the amorphous film; and
    forming first and second electrodes on the metal layer.

5. The method of crystallizing an amorphous film according to claim 1, wherein the step of forming the amorphous film comprises:
    forming a first amorphous film on the substrate;
    forming the metal layer on the first amorphous film;
    forming first and second electrodes on the metal layer; and
    forming a second amorphous film on the first amorphous film and the first and second electrodes.

6. The method of crystallizing an amorphous film according to claim 1, wherein the step of forming the amorphous film comprises:
    forming the metal layer on the substrate;
    forming first and second electrodes on the metal layer;
    forming an amorphous film on the first and second electrodes and the substrate.

7. The method of crystallizing an amorphous film according to claim 1, wherein the amorphous film comprises silicon.

8. The method of crystallizing an amorphous film according to claim 1, wherein the first and second electrodes are selected from the group consisting of a transition metal and an alloy of a transition metal.

9. The method of crystallizing an amorphous film according to claim 1, wherein the metal layer has a thickness less than 2 Å.

10. The method of crystallizing an amorphous film according to claim 1, wherein the first and second electrodes are separated by a distance ranging from about 0.01 to 100 cm.

11. The method of crystallizing an amorphous film according to claim 1, wherein the first and second electrodes are separated by a distance ranging from about I to 50 cm.

12. The method of crystallizing an amorphous film according to claim 1, wherein the electric field is formed by applying a voltage ranging from about 1 to 1,000,000 V between the first and second electrodes.

13. The method of crystallizing an amorphous film according to claim 1, wherein the electric field is formed by applying a voltage ranging from about 10 to 10,000 V between the first and second electrodes.

14. The method of crystallizing an amorphous film according to claim 1, wherein the electric field is formed by applying a voltage ranging from about 1 to 1,000,000 V between the first and second electrodes and the substrate is applied with a thermal treatment for about 1–20 minutes at about 300 to 800° C.

15. The method of crystallizing an amorphous film according to claim 1, wherein the electric field is formed by applying a variable voltage between the first and second electrodes during the thermal treatment.

16. The method of crystallizing an amorphous film according to claim 1, wherein the step of forming the electric field comprises:

forming first and second electrodes on surface ends of the amorphous film; and applying a voltage between the first and second electrodes.

17. The method of crystallizing an amorphous film according to claim 1, wherein the step of forming the electric field comprises:

locating the amorphous film between first and second electrodes, but not in physical contact with the first and second electrodes; but not in physical contact with the first and second electrodes; and applying a voltage between the first and second electrodes.

18. A method of crystallizing an amorphous film comprising the steps of:

forming an amorphous film capable of being crystallized on a substrate, the amorphous film being in contact with a metal layer; and crystallizing the amorphous film by forming an electric field in the amorphous film and the metal layer, while simultaneously subjecting the amorphous film and the metal layer to a thermal treatment, thereby crystallizing the amorphous film, wherein the step of forming the electric field comprises forming first and second electrodes on the amorphous film and forming an electric field between the first and second electrodes, and wherein the step of forming the amorphous film comprises forming a first amorphous film on the substrate, forming the metal layer on the first amorphous film, and forming first and second electrodes on the metal layer.

19. The method of crystallizing an amorphous film according to claim 18, wherein the step of forming the amorphous film further comprises the step of forming a second amorphous film on the first amorphous film and the first and second electrodes.

20. A method of crystallizing an amorphous film comprising the steps of:

forming an amorphous film capable of being crystallized on a substrate, the amorphous film being in contact with a metal layer; and crystallizing the amorphous film by forming an electric field in the amorphous film and the metal layer, while simultaneously subjecting the amorphous film and the metal layer to a thermal treatment, thereby crystallizing the amorphous film, wherein the step of forming the electric field comprises forming first and second electrodes on the amorphous film and forming an electric field between the first and second electrodes, and wherein the step of forming the amorphous film comprises forming the metal layer on the substrate, forming first and second electrodes on the metal layer, and forming an amorphous film on the first and second electrodes and the substrate.

21. A method of crystallizing an amorphous film comprising the steps of:

forming an amorphous film capable of being crystallized on a substrate, the amorphous film being in contact with a metal layer, the metal layer having a thickness less than 2 Å and crystallizing the amorphous film by forming an electric filed in the amorphous film and the metal layer by applying a voltage ranging from about 1 to 1,000,000 V between the first and second electrodes, while simultaneously subjecting the amorphous film and the metal layer to a thermal treatment, thereby crystallizing the amorphous film, wherein the steps of forming the electric filed comprises forming first and second electrodes on the amorphous film and forming an electric field between the first and second electrodes, the first and second electrodes being separated by a distance ranging from about 0.0001 to 500 cm.

22. A method of crystallizing an amorphous film, the method comprising the steps of:

forming a first amorphous film over a substrate;

forming first and second electrodes on the first amorphous film, the first and the second electrodes being separated by a distance ranging from about 0.0001 to 500 cm;

forming a second amorphous film over the first and second electrodes and the first amorphous film; and crystallizing the first amorphous film by forming an electric field across the first amorphous film using the first and second electrodes while subjecting the first amorphous film to a thermal treatment.

23. The method according to claim 22, wherein the first and second electrodes are selected from a group consisting of transition metals and alloys including at least one transition metal.

24. The method according to claim 23, wherein the first and second electrodes include Ni.

25. The method according to claim 22, wherein the electric field is formed by applying a voltage ranging from 1 to 1,000,000 V between the first and second electrodes.

26. The method according to claim 22, wherein the electric field is formed by applying a time-varying voltage between the first and second electrodes during the thermal treatment.

27. The method according to claim 22, wherein the crystallizing step crystallizes the second amorphous silicon at the same time as the first amorphous silicon.

28. A method of crystallizing an amorphous film, the method comprising the steps of:

forming first and second electrodes on a substrate;

forming an amorphous film over the first and second electrodes and a portion of the substrate; and crystallizing the amorphous film by forming an electric field across the amorphous film using the first and second electrodes while subjecting the amorphous film to a thermal treatment.

29. The method according to claim 28, wherein the first and second electrodes are selected from a group consisting of transition metals and alloys including at least one transition metal.

30. The method according to claim 29, wherein the first and second electrodes include Ni.

31. The method according to claim 28, wherein the first and second electrodes are separated by a distance ranging from 0.0001 cm to 500 cm.

32. The method according to claim 28, wherein the electric field is formed by applying a voltage ranging from 1 to 1,000,000 V between the first and second electrodes.

33. The method according to claim 28, wherein the electric field is formed by applying a time-varying voltage between the first and second electrodes during the thermal treatment.

34. A method of crystallizing an amorphous film comprising the steps of:

forming an amorphous film capable of being crystallized on a substrate, the amorphous film being in contact with a metal layer;

forming first and second electrodes on the amorphous film, the first and the second electrodes being separated by a distance ranging from about 0.0001 to 500 cm;

forming an electric field between the first and second electrodes; and crystallizing the amorphous film by forming an electric filed in the amorphous film and the metal layer, while simultaneously subjecting the amorphous film and the metal layer to a thermal treatment, thereby crystallizing the amorphous film, wherein a speed of crystallization increases with higher temperature and a higher electric field requires a lower temperature.

35. The method of crystallizing an amorphous film according to claim 34, further comprising the steps of forming the metal layer between the first and second electrodes using plasma.

36. The method of crystallizing an amorphous film according to claim 34, further comprising the step of forming the metal layer between the first and second electrodes by applying a solution comprising a metal.

37. The method of crystallizing an amorphous film according to claim 34, wherein the step of forming the amorphous film comprises:

forming an amorphous film on the substrate;

forming the metal layer on the amorphous film; and forming first and second electrodes on the metal layer.

38. The method of crystallizing an amorphous film according to claim 34, wherein the step of forming the amorphous film comprises:

forming a first amorphous film on the substrate;

forming the metal layer on the first amorphous film;

forming first and second electrodes on the metal layer; and forming a second amorphous film on the first amorphous film and the first and second electrodes.

39. The method of crystallizing an amorphous film according to claim 34, wherein the step of forming the amorphous film comprises:

forming the metal layer on the substrate;

forming first and second electrodes on the metal layer;

forming an amorphous film on the first and second electrodes and the substrate.

40. The method of crystallizing an amorphous film according to claim 34, wherein the amorphous film comprises silicon.

41. The method of crystallizing an amorphous film according to claim 34, wherein the first and second electrodes are selected from the group consisting of a transition metal and an alloy of a transition metal.

42. The method of crystallizing an amorphous film according to claim 34, wherein the metal layer has a thickness less than 2 Å.

43. The method of crystallizing an amorphous film according to claim 35, further comprising increasing a temperature of the thermal treatment from a first temperature to a second temperature, the second temperature being higher than the first temperature.

44. The method of crystallizing an amorphous film according to claim 34, wherein the first and second electrodes are separated by a distance ranging from about 0.01 to 100 cm.

45. The method of crystallizing an amorphous film according to claim 34, wherein the first and second electrodes are separated by a distance ranging from about I to 50 cm.

46. The method of crystallizing an amorphous film according to claim 34, wherein the electric field is formed by applying a voltage ranging from about 1 to 1,000,000 V between the first and second electrodes.

47. The method of crystallizing an amorphous film according to claim 34, wherein the electric field is formed by applying a voltage ranging from about 10 to 10,000 V between the first and second electrodes.

48. The method of crystallizing an amorphous film according to claim 34, wherein the electric field is formed by applying a voltage ranging from about 1 to 1,000,000 V between the first and second electrodes and the substrate is applied with a thermal treatment for about 1–20 minutes at about 300 to 800° C.

49. The method of crystallizing an amorphous film according to claim 34, wherein the electric field is formed by applying a variable voltage between the first and second electrodes during the thermal treatment.

50. The method of crystallizing an amorphous film according to claim 34, wherein the step of forming the electric field comprises:

forming first and second electrodes on surface ends of the amorphous film; and applying a voltage between the first and second electrodes.

51. The method of crystallizing an amorphous film according to claim 34, wherein the step of forming the electric field comprises:

locating the amorphous film between a first electrode and a second electrode, but not in physical contact with the first electrode; and not in physical contact with the second electrode; and applying a voltage between the first electrode and the second electrode.

52. A method of crystallizing an amorphous film, comprising the steps of:

forming an amorphous film over a substrate;

forming first and second electrodes on the amorphous film; and crystallizing the amorphous film by forming an electric field across the amorphous film while subjecting the amorphous film to a thermal treatment.

53. The method according to claim 52, wherein the step of forming an electric field comprises the steps of:

forming the electric field between the first and second electrodes.

54. The method of crystallizing an amorphous film according to claim 43, wherein the electric field is held substantially constant.

55. The method of crystallizing an amorphous film according to claim 34, further comprising increasing the electric field from a first level to a second level, the second level being higher than the first level.

56. The method of crystallizing an amorphous film according to claim 55, wherein a temperature of the thermal treatment is held substantially constant.

* * * * *